(12) United States Patent
Sasaki et al.

(10) Patent No.: US 7,157,832 B2
(45) Date of Patent: Jan. 2, 2007

(54) VIBRATION WAVE LINEAR MOTOR AND LENS IMPLEMENT USING VIBRATION WAVE LINEAR MOTOR

(75) Inventors: Yasuo Sasaki, Tokyo (JP); Toshihiro Nakao, Tokyo (JP); Heiji Ogino, Tokyo (JP)

(73) Assignee: Olympus Corporation, Tokyo (JP)

( * ) Notice: Subject to any disclaimer, the term of this patent is extended or adjusted under 35 U.S.C. 154(b) by 172 days.

(21) Appl. No.: 10/901,730

(22) Filed: Jul. 29, 2004

(65) Prior Publication Data

US 2005/0029876 A1 Feb. 10, 2005

(30) Foreign Application Priority Data

Aug. 6, 2003 (JP) ............... 2003-206256

(51) Int. Cl.
*H01L 41/08* (2006.01)
(52) U.S. Cl. .................................. 310/323.17
(58) Field of Classification Search ........... 310/328, 310/323.17, 323.09, 316–318, 323.03, 323.02; 359/824; 396/133; *H01L 41/08*
See application file for complete search history.

(56) References Cited

U.S. PATENT DOCUMENTS

| | | | |
|---|---|---|---|
| 5,644,440 A | 7/1997 | Akada | |
| 5,812,330 A | 9/1998 | Akada | |
| 6,125,605 A * | 10/2000 | Young | 52/717.01 |
| 6,188,161 B1 * | 2/2001 | Yoshida et al. | 310/328 |
| 6,765,334 B1 * | 7/2004 | Iino et al. | 310/323.02 |
| 7,084,550 B1 * | 8/2006 | Sasaki et al. | 310/323.17 |

FOREIGN PATENT DOCUMENTS

| | | |
|---|---|---|
| JP | 4-69072 | 3/1992 |
| JP | 7-163162 | 6/1995 |
| JP | 8-179184 | 7/1996 |
| JP | 9-149664 | 6/1997 |

* cited by examiner

*Primary Examiner*—Darren Schuberg
*Assistant Examiner*—Karen Addison
(74) *Attorney, Agent, or Firm*—Scully, Scott, Murphy & Presser, P.C.

(57) ABSTRACT

A vibration wave linear motor comprises a vibrator unit having two driving contacting parts which are respectively formed on top and bottom surfaces of the vibrator unit, two guide members guiding the running of the vibrator unit by sandwiching the vibrator unit in parallel with the running direction. The upper guide member is fixed to the supporting member. The lower guide member is held in shaft bearing long holes, pressed upward by coil springs within hollow convex parts. The vibrator unit self-runs and moves forward and backward between the two guide members with an ultrasonic vibration. A linking pin fixed on the side surface of the vibrator unit engages with the member to be driven, so that moving force is transmitted.

18 Claims, 11 Drawing Sheets

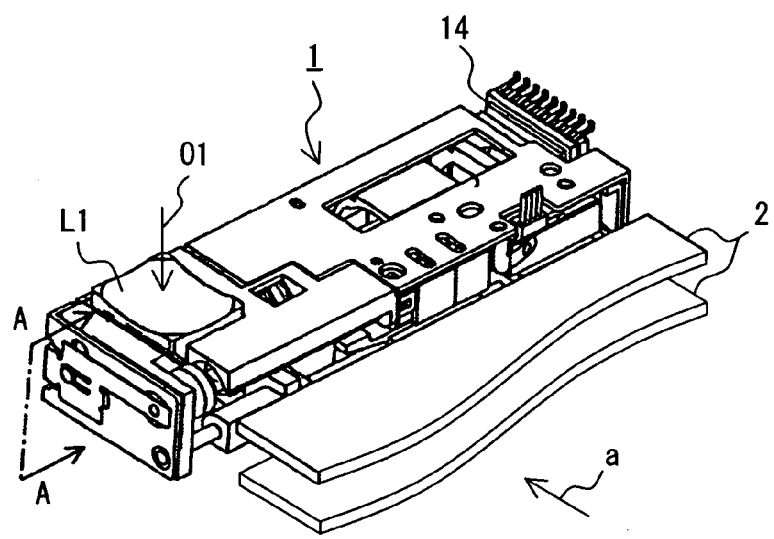
F I G. 1A
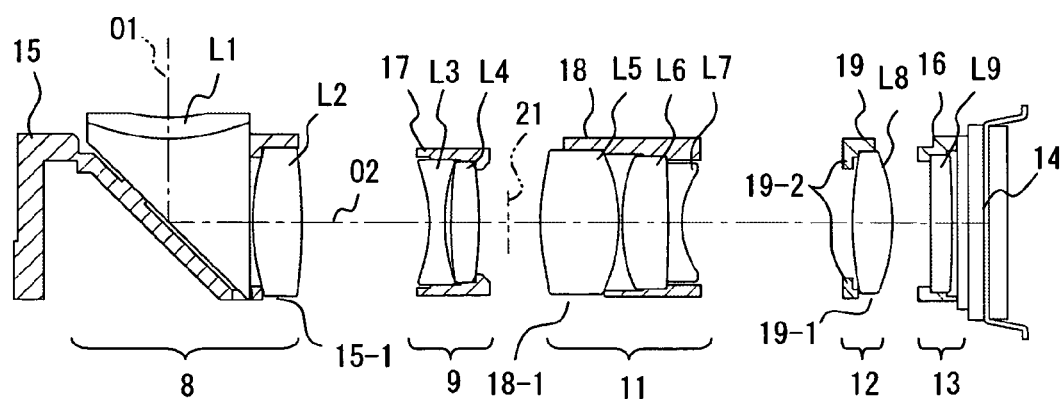
F I G. 1B

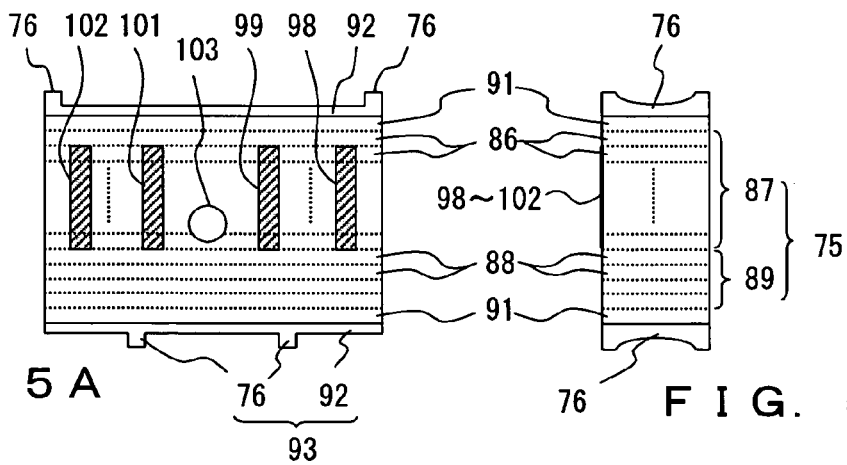
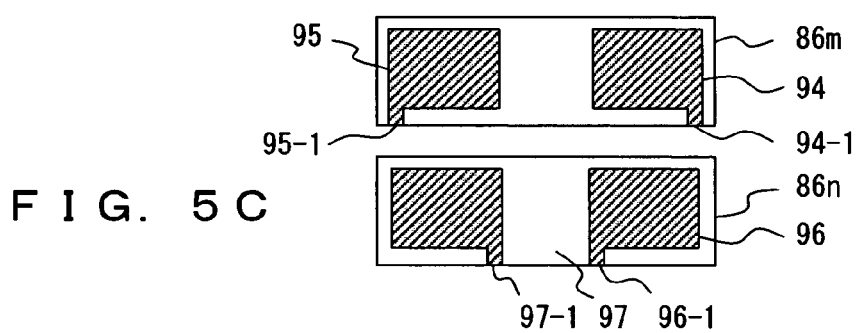
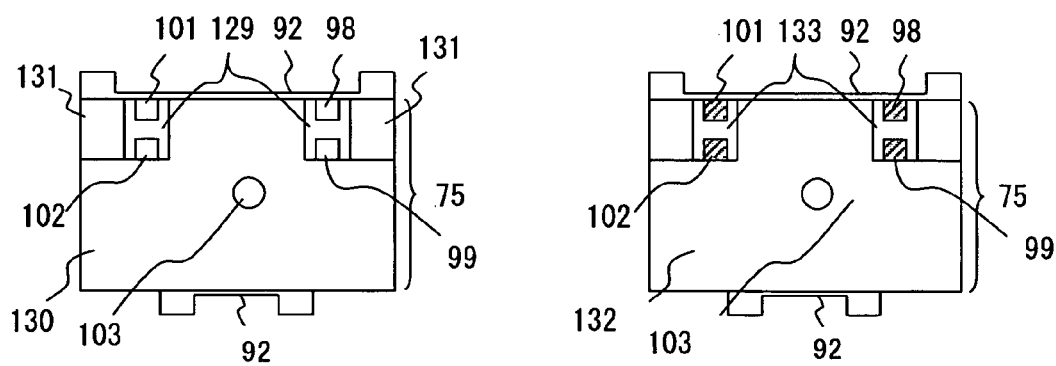
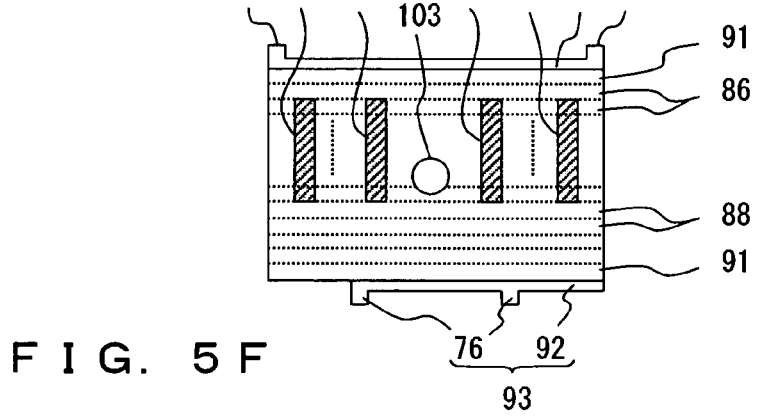

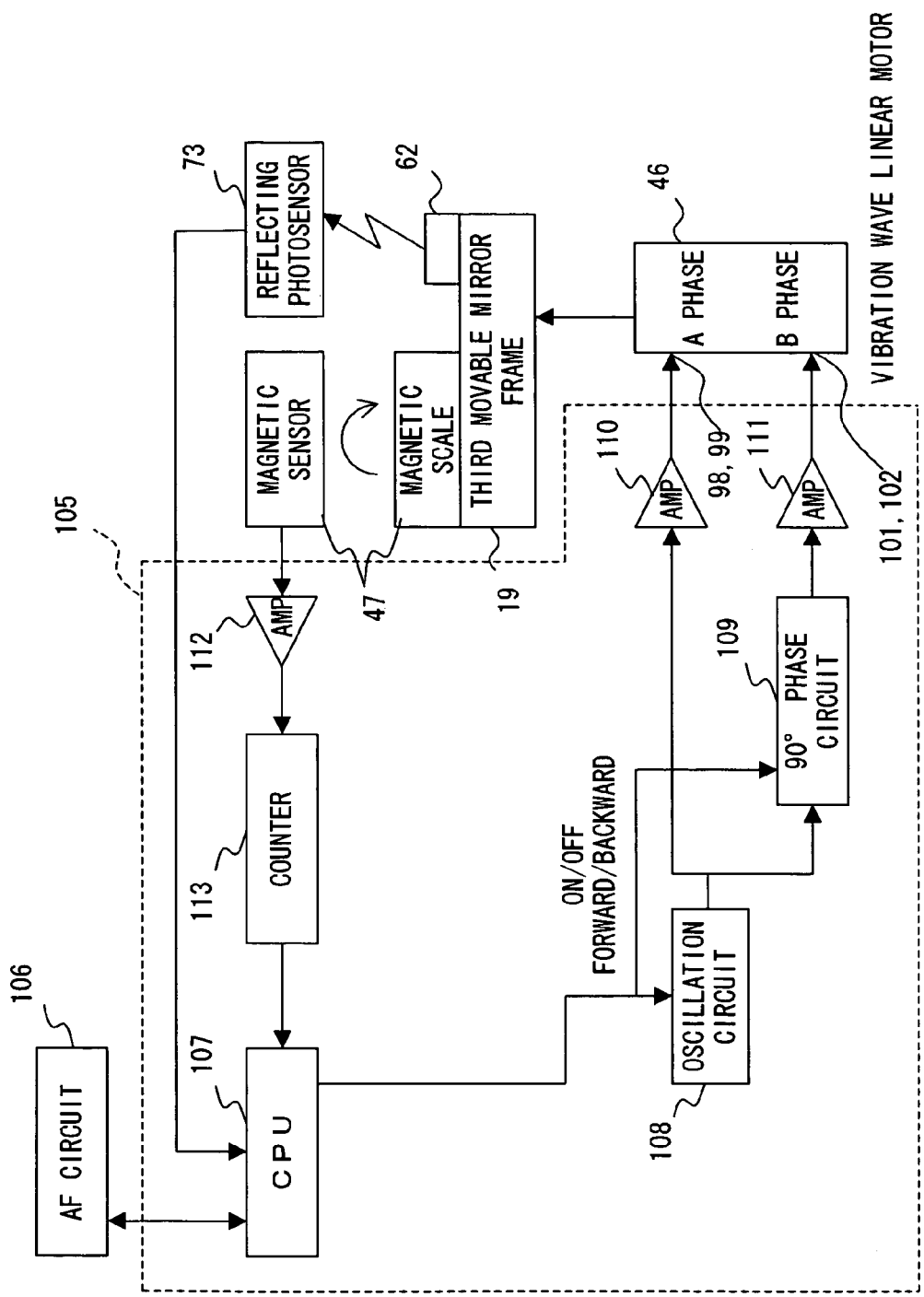
F I G. 6

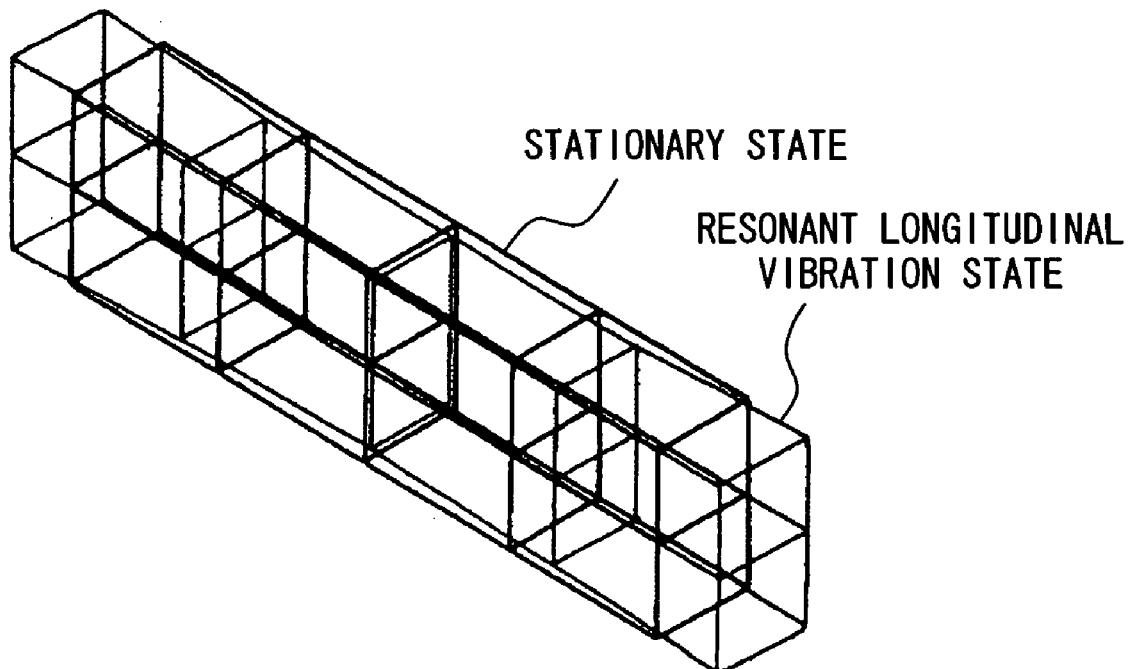
F I G. 7 A
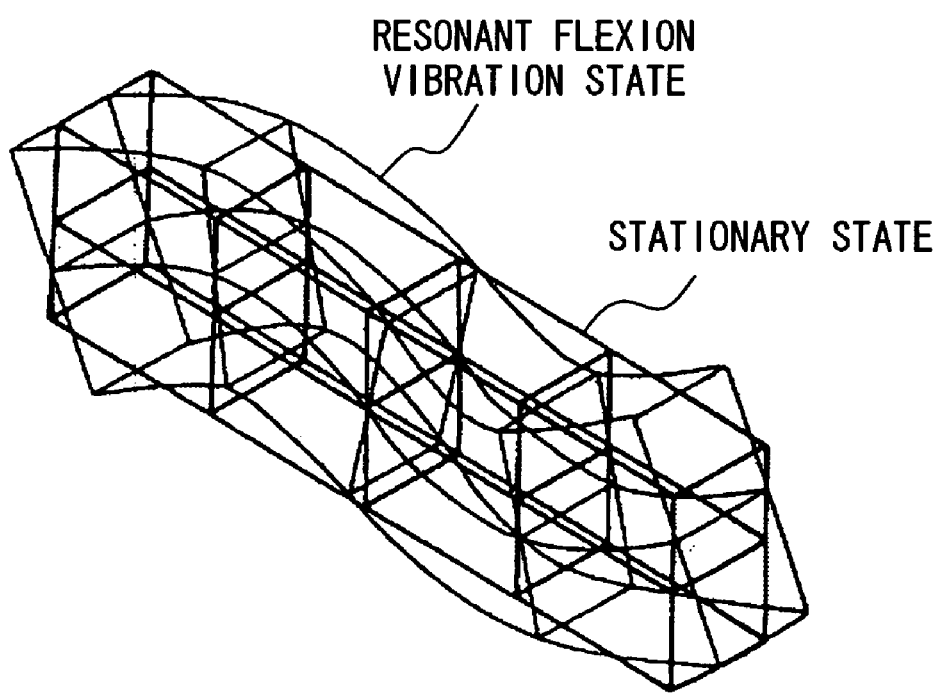
F I G. 7 B

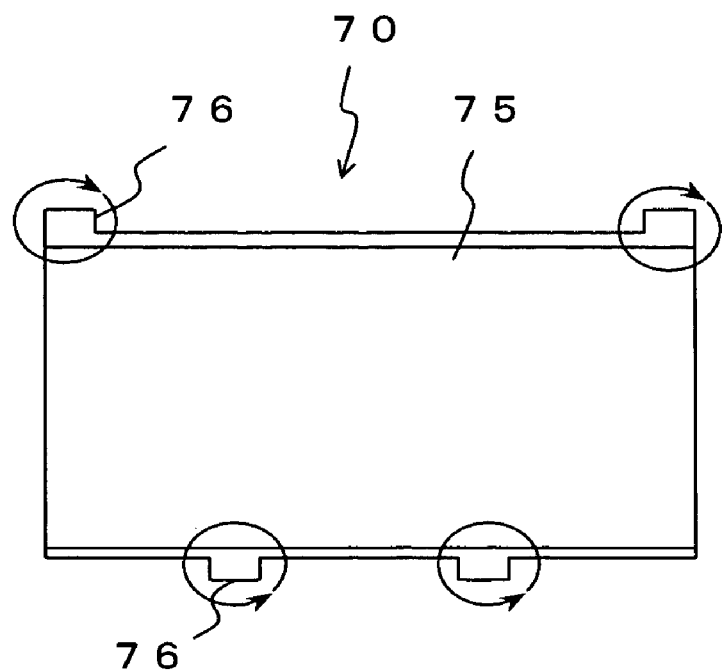
F I G. 8 A
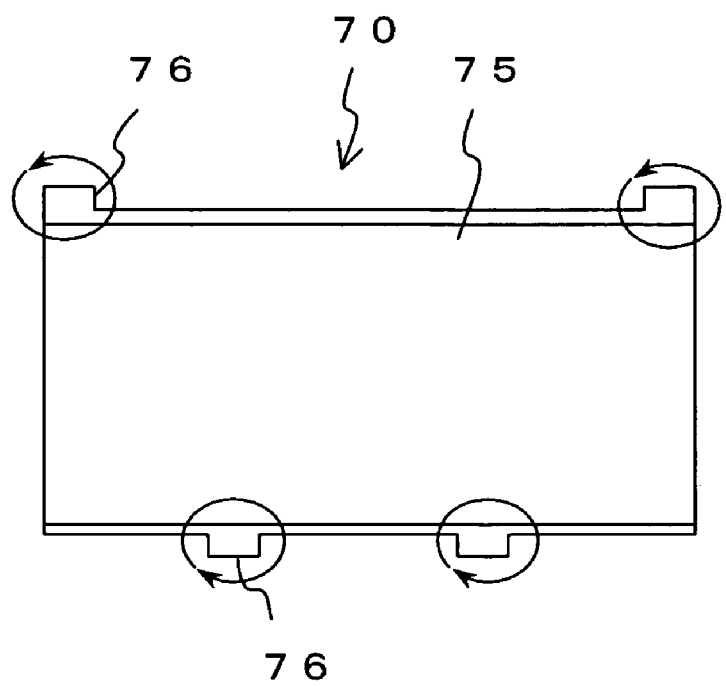
F I G. 8 B

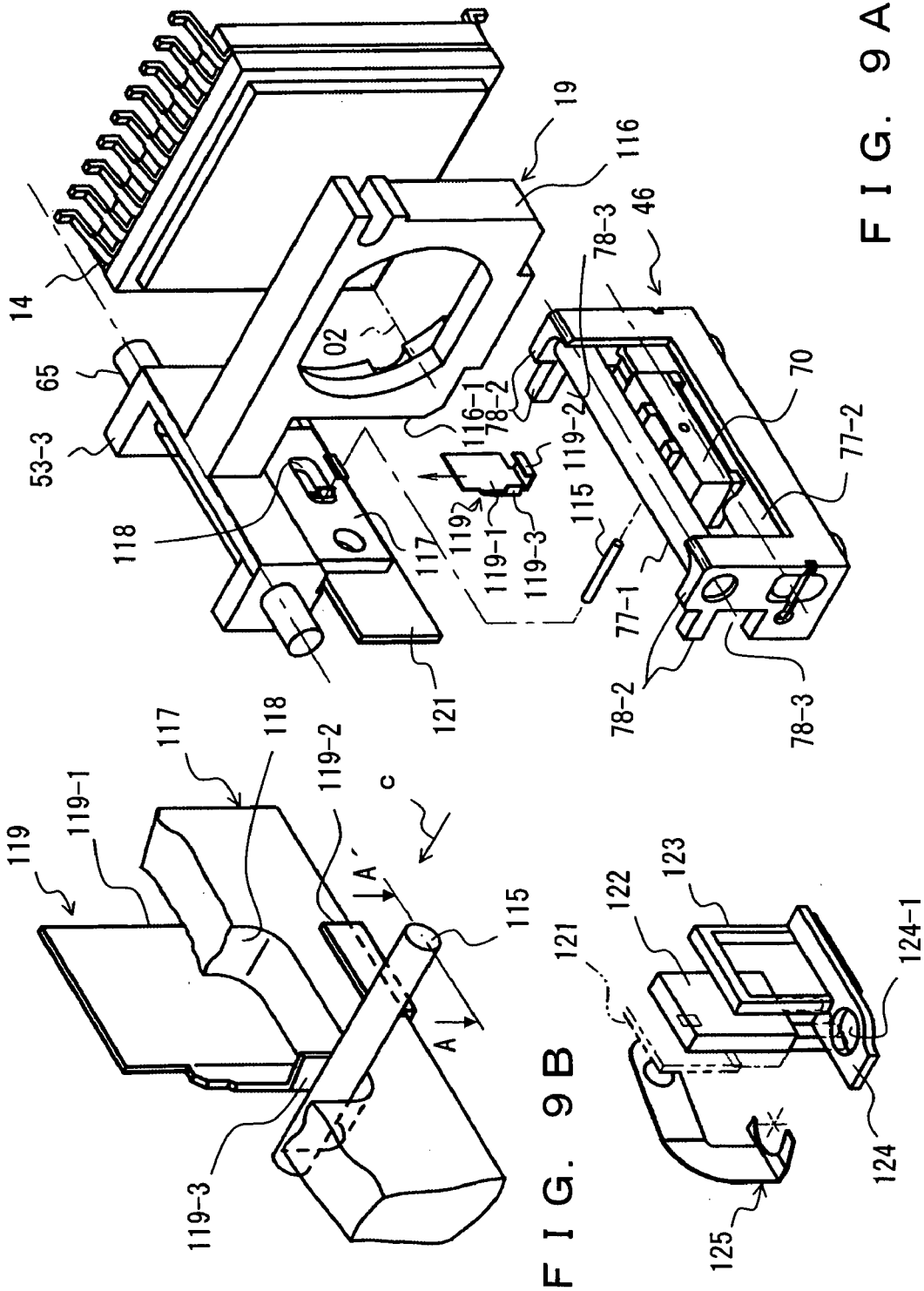

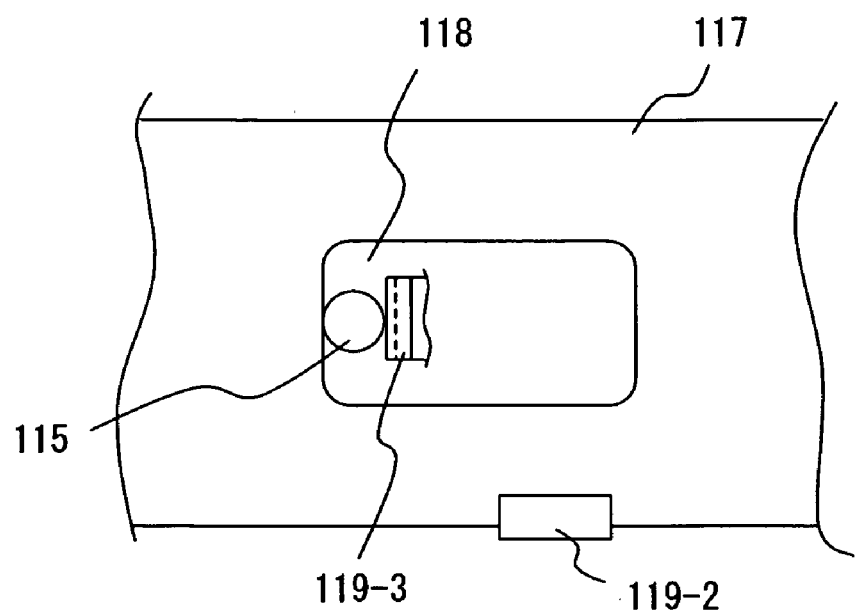
F I G. 1 0 A
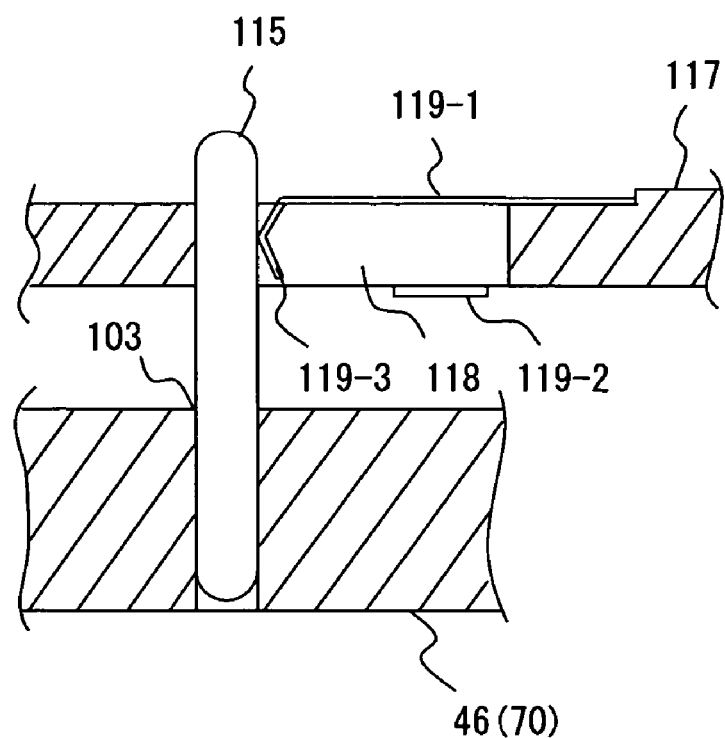
F I G. 1 0 B

VIBRATION WAVE LINEAR MOTOR AND LENS IMPLEMENT USING VIBRATION WAVE LINEAR MOTOR

CROSS REFERENCE TO RELATED APPLICATION

This application is based upon and claims the benefit of priority from the prior Japanese Application No. 2003-206256, filed Aug. 6, 2003, the entire contents of which are incorporated herein by reference.

BACKGROUND OF THE INVENTION

1. Field of the Invention

The present invention relates to an ultrasonic linear motor using an ultrasonic vibrator, and more particularly, to a vibration wave linear motor that can be reduced in size with a simple configuration.

2. Description of the Related Art

In recent years, attention has been paid to an ultrasonic motor (vibration wave motor) as a new motor replacing an electromagnetic motor. This ultrasonic motor has advantages such that (a) high thrust at a low speed can be obtained without a gear, (b) holding force is high, (c) a stroke is long, and a resolution is high, (d) noise is very low, and (e) magnetic noise is not caused, and noise influence is not exerted in comparison with a conventional electromagnetic motor.

As a conventional ultrasonic motor having such advantages, a linear-type ultrasonic motor as one basic form using an ultrasonic vibrator is proposed by the present applicant (for example, paragraphs [0035] to [0040] and FIG. 7 of Japanese Patent Publication No. HEI07-163162).

Additionally, it is proposed by utilizing the above described characteristics that an ultrasonic motor is used as a driving source for moving a lens frame of a camera backward and forward by providing a vibrator integrally with the lens frame, which is a lens holding member, and by moving the lens frame backward and forward with reference to a fixed shaft with the vibrator (for example, see Abstract of the Disclosure, and FIG. 1 of Japanese Patent Publication No. HEI08-179184).

Also a card carrying apparatus using an ultrasonic motor is proposed. This ultrasonic motor comprises a ring-shaped vibration board that vibrates in multiple modes, and a pair of guide rails where grooves for guiding the vibration board are formed. As one of the guide rails, a movable rail is arranged, and presses the vibration board. As a result, the vibration board linearly moves along the guide rails by being vibrated (for example, see line 20 in the left column on page 3 to line 13 in the left column on page 4, and FIGS. 1 and 3 of Japanese Patent Publication No. HEI04-069072).

Furthermore, a linear ultrasonic motor that linearly moves a shaft by pressing a vibrator and the shaft to be driven with the use of a pressure roller, and by ultrasonic-vibrating the vibrator is proposed. Besides, it is recited that the cross section of the vibrator is made V-shaped or arc-shaped in the pressing part of the vibrator and the shaft (for example, see "Abstract of the Disclosure, and FIG. 1 of Japanese Patent Publication No. HEI09-149664).

SUMMARY OF THE INVENTION

A vibration wave linear motor in a first aspect of the present invention comprises: a vibrator unit configured by comprising a piezoelectric unit; driving contacting parts respectively provided on two opposed surfaces of the vibrator unit; two guide members sandwiching the vibrator unit via the driving contacting parts; and a pressing member pressing one of the two guide members against the other, and generating pressing force between the two guide members and the driving contacting parts, wherein the driving contacting parts convert a vibration generated by applying a voltage to the vibrator unit into driving force, so that the vibrator and the two guide members make a relative move.

A vibration wave linear motor in a second aspect of the present invention comprises: a vibrator having a vibrator unit configured by comprising a piezoelectric unit, and a coupled driving contacting part that is made of a material different from the vibrator unit, and arranged on the vibrator unit by coupling a plurality of driving contacting parts integrally; a member to be driven, which contacts the driving contacting parts of the vibrator; and a pressing member relatively pressing the member to be driven against the driving contacting parts, and generating pressing force between the driving contacting parts and the member to be driven, wherein the driving contacting parts convert a vibration generated by applying a voltage to the vibrator unit into driving force, so that the vibrator and the member to be driven make a relative move.

Furthermore, a lens implement according to the present invention comprises the vibration wave linear motor in the first or the second aspect of the invention as a driving source of a lens for achieving a focus.

BRIEF DESCRIPTION OF THE DRAWINGS

FIG. 1A is a perspective view showing the outer appearance of a lens implement comprising a vibration wave linear motor according to the present invention;

FIG. 1B is a schematic showing a simplified configuration of respective lens implement when a cross section, taken along an arrow line A–A', of the lens implement shown in FIG. 1A is viewed in the direction of an arrow a;

FIG. 5A is a front view of a vibrator of a vibration wave linear motor;

FIG. 5B is a side view of the vibrator shown in FIG. 5A;

FIG. 5C shows an arrangement of piezoelectric sheets and electrodes of the vibrator shown in FIGS. 5A and 5B;

FIGS. 5D and 5E respectively show two other configuration examples of the vibrator;

FIG. 5F illustrate another shape of a coupled driving contacting part;

FIG. 6 is a circuit diagram showing a driving circuit driving and controlling a vibration wave linear motor;

FIGS. 7A and 7B are perspective views schematically explaining ultrasonic elliptical vibrations of the vibrator unit of the vibration wave linear motor;

FIGS. 8A and 8B are schematics showing the elliptical vibration of the driving contacting parts of the vibrator when an alternating current voltage having a phase that is different by $\pi/2$ in the neighborhood of 160 kHz is applied;

FIG. 9A is a perspective view explaining a method linking the vibration wave linear motor and a third mobile lens frame;

FIG. 9B is an enlarged perspective view showing only the linked portion;

FIG. 9C is an enlarged view showing a magnetic sensor unit detecting the move amount of a third movable lens frame;

FIG. 10A is a schematic showing FIG. 9B when viewed in the direction of an arrow c;

FIG. 10B is a cross-sectional view of FIG. 9B when taken along an arrow line A–A'.

DESCRIPTION OF THE PREFERRED EMBODIMENTS

Figure 2:
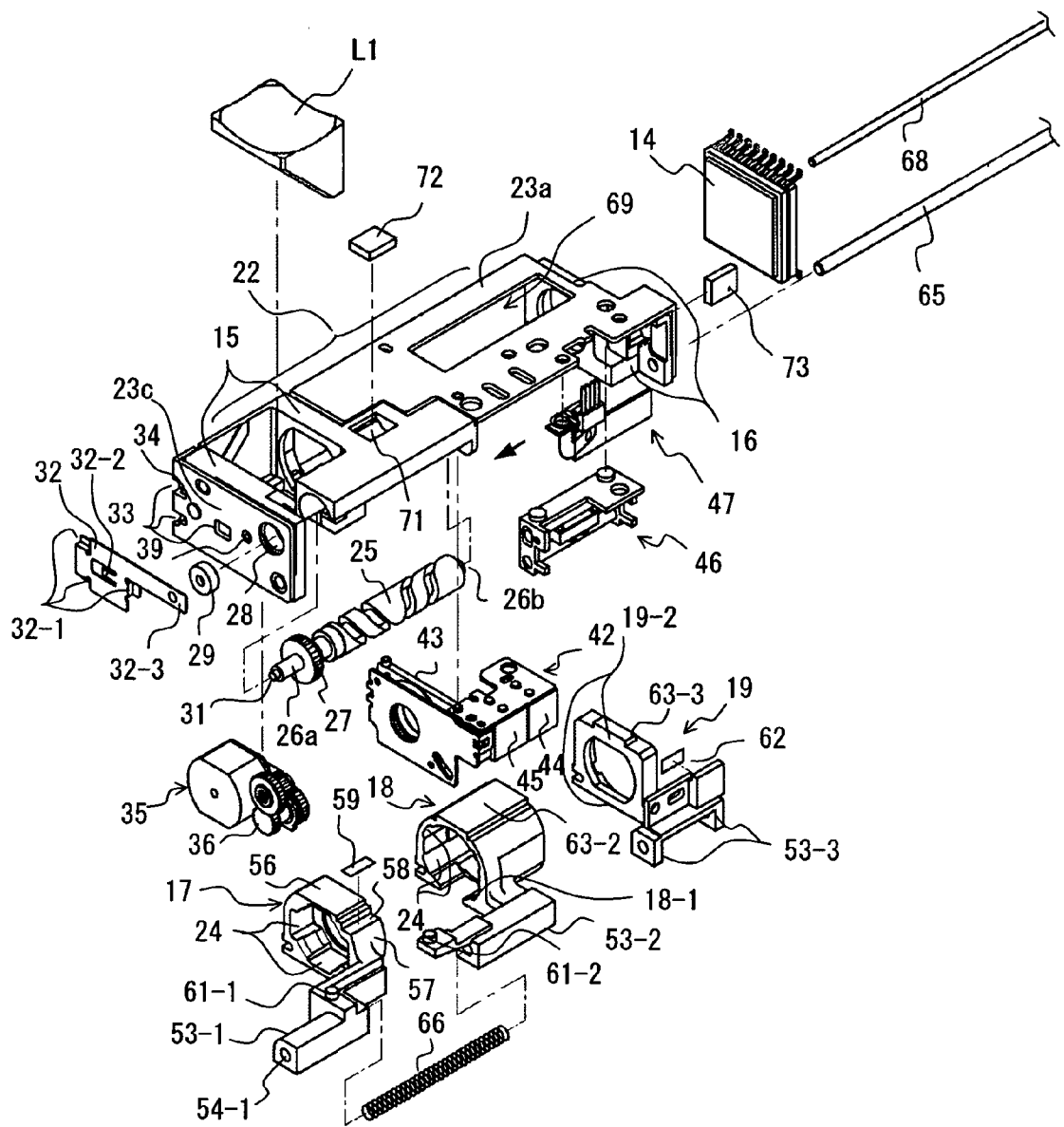
FIG. 2 is a perspective view showing the disassembly of the lens implement when viewed from upward.

A preferred embodiment according to the present invention is described below with reference to the drawings.

FIG. 1A is a perspective view showing the outer appearance of a lens implement comprising a vibration wave linear motor according to the present invention, whereas FIG. 1B is a cross-sectional view, taken along an arrow line A–A', of the lens implement shown in FIG. 1A when viewed in the direction of an arrow a in FIG. 1A, and shows a simplified configuration of respective lens implement.

FIG. 1A also shows part of a circuit board 2 comprising a control circuit which controls the driving of respective units of the lens implement assembled within the housing of a main body apparatus such as a camera, etc. along with the lens implement 1.

The lens implement 1 shown in FIG. 1A reflects a pencil of light from a subject, which is incident from a shooting lens window, not shown, of the housing of a main body apparatus to a lens L1 along a shooting optical axis O1 (indicated by the vertical direction in FIG. 1), to be bent almost at a right angle in the horizontal direction (an obliquely upper right direction in FIG. 1) by using a prism formed integrally with the lens L1. This lens implement 1 generates a captured image by guiding the incident pencil of light to an image capturing element 14, which is provided at the end (the end in the obliquely upper right direction in FIG. 1) of the lens implement 1 and configured, for example, by a CCD, etc., along the bent second optical axis O2 shown in FIG. 1B.

As shown in FIG. 1B, the lens implement 1 includes a plurality of lenses configured by a first fixed lens unit 8 composed of lenses L1 and L2, a first movable lens unit 9 composed of lenses L3 and L4, a second movable lens unit 11 composed of lenses L5, L6, and L7, a third movable lens unit 12 composed of a lens L8, and a second fixed lens unit 13 composed of a lens L9, along the second optical axis O2 bent in the horizontal direction. Additionally, the image capturing element 14 is arranged at the dead end of this lens group.

The lens L1 of the first fixed lens unit 8 is formed integrally with a prism that changes the course of the pencil of light along the second optical axis O2 by reflecting the pencil of light from the subject, which is incident from the above described shooting lens window along the shooting optical axis O1, to be bent almost by 90° in the horizontal direction. The lens L1 is held by a first fixed lens frame unit 15 along with the lens L2, and fixed within the lens implement 1.

The first fixed lens frame unit 15 and the second fixed lens frame unit 16 are integrally formed by being molded with resin at the end of a metal frame, which will be described later and has an almost L-shaped cross section cut vertically with reference to the second optical axis O2, in a long side direction.

Between the first fixed lens frame unit 15 and the second fixed lens frame unit 16, a first movable lens frame 17 holding the first movable lens unit 9, a second movable lens frame 18 holding the second movable lens unit 11, and a third movable lens frame 19 holding the third movable lens unit 12 are arranged.

The first movable lens frame 17, the second movable lens frame 18, and the third movable lens frame 19 respectively hold the first movable lens unit 9, the second movable lens unit 11, and the third movable lens unit 12 to be independently movable along the second optical axis O2 that is bent almost at the right angle by the lens L1 (also referred to as the prism L1 hereinafter).

The first movable lens unit 9 and the second movable lens unit 11 are provided to change the focal distance of the pencil of light of the subject, which is incident along the second optical axis O2 of the optical system of the lens implement 1. In other words, the first movable lens frame 17 and the second movable lens frame 18, which respectively hold the first movable lens unit 9 and the second movable lens unit 11, are provided to adjust the zoom ratio of the lens system.

Additionally, the third movable lens unit 12 is provided to adjust a focus at which the pencil of light forms an image on the image capturing unit 14. In other words, the third movable lens frame 19 holding the third movable lens unit 12 is provided as a lens frame for achieving a focus, which can freely move in the direction of the second optical axis O2.

Furthermore, 21 between the first movable lens unit 9 and the second movable lens unit 11 indicates a position of an aperture.

Still further, in this lens unit, frame cut parts 15-1, 18-1, and 19-1 are formed by cutting at a part or the whole of frame walls in either of the upper and lower portions of the second optical axis O2 (portions corresponding to the bottoms of the lenses in a lower portion in the example shown in FIG. 1B), of the first fixed lens frame unit 15, the second movable lens frame 18, and the third movable lens frame respectively holding the first fixed lens unit 8, the second movable lens unit 11, and the third movable lens unit 12, which respectively include the lenses L2, L5, and L8 of a relatively large diameter, in order to make the thickness in the direction of height (actually, a thickness in the direction of depth as a lens unit for shooting) as thin as possible.

For the second and the third movable lens frames 18 and 19, the strengths of which become weak by the amount of the cut frame walls, and which do not have another reinforced portion unlike the first fixed lens frame 15, a convex part which protrudes externally and will be described later, is provided on a side opposite to the cut part with reference to the second optical axis O2, namely, on the frame wall on the top surface. The reason why the frame walls of the second and the third movable lens frames 18 and 19 on the top surface look slightly thick in FIG. 1B is that the cross section of the convex part is depicted.

Additionally, since the whole of the third movable lens frame 19 is thin and weak in the direction of a width, it can be possibly insufficient to make reinforcement only with the above described convex part. Therefore, a protruding part 19-2 is provided to wrap from a lens barrel part formed on a side opposite to the cut part 19-1 formed at the bottom side of the lens L8 toward the left hand side, which is out of range of the effective light beam of the lens L8.

FIG. 2 is a perspective view showing the disassembly of the lens implement 1 when viewed from upward.

Figure 3:
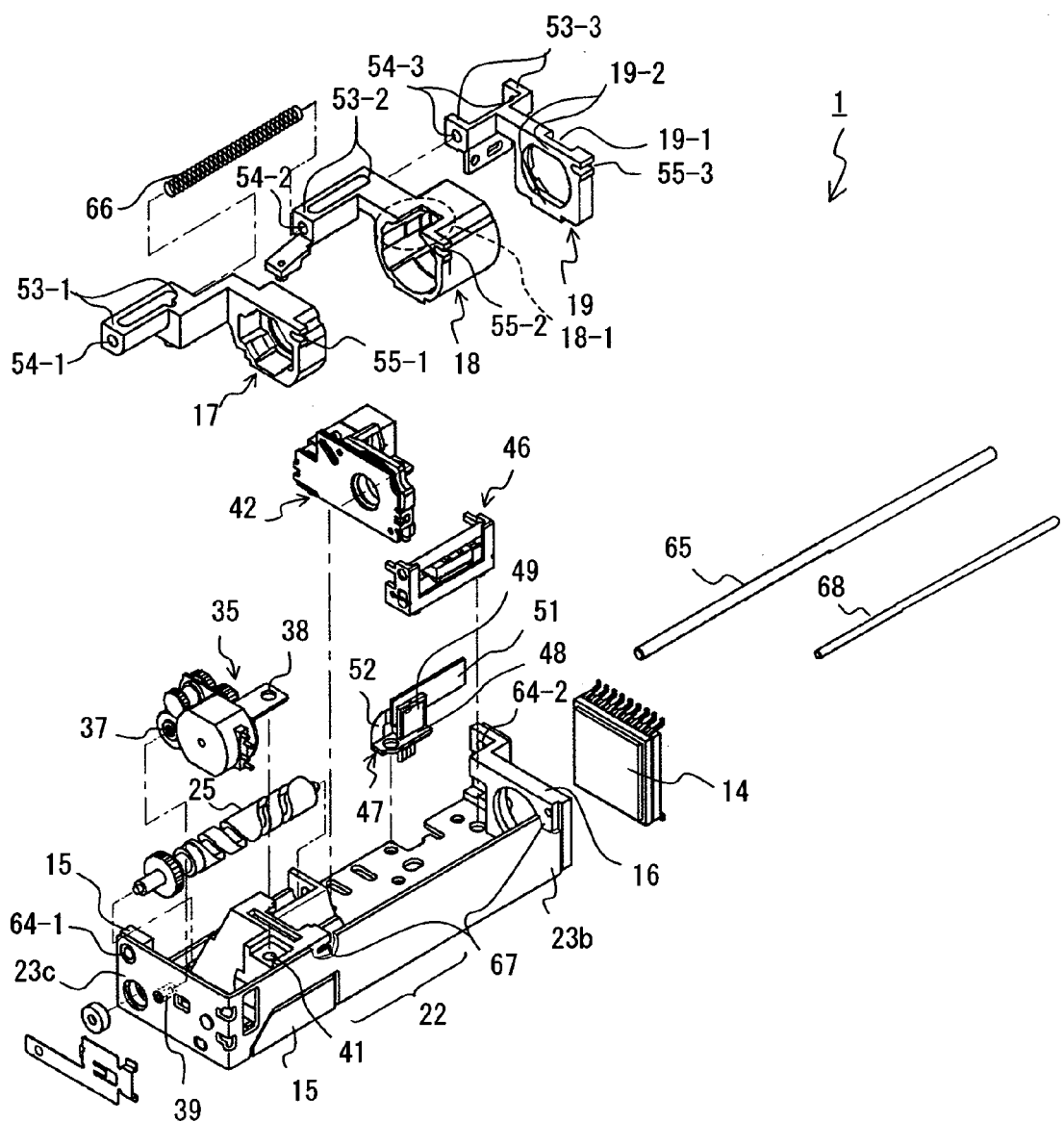
FIG. 3 is a perspective view showing the disassembly of the lens implement upside down when viewed from downward.

FIG. 3 is a perspective view showing the disassembly of the lens implement 1 upside down when viewed from downward. In FIGS. 2 and 3, the same constituent elements as those shown in FIGS. 1A and 1B are denoted with the same reference numerals.

As shown in FIGS. 2 and 3, the lens implement 1 comprises a main fixed lens frame 22. When all of the constituent elements shown in FIG. 2 or 3 are assembled and accommodated inside and outside the main fixed lens frame 22, the whole of the lens implement 1 has an outer shape, shown in FIG. 1A, of the main body of the apparatus where the constituent elements are comprised on two main surfaces of opposed rectangles, and included in a flat space enclosed by the two main surfaces.

The above described main fixed lens frame 22 comprises a metal frame 23a forming at least one of the above described 2 main surfaces. In the configuration of this lens implement 1, the other main surface is made open. Also one side of the flat space enclosed by the one main surface formed by the metal frame 23a and the other open main surface is configured by a metal frame 23b provided almost at a right angle from the metal frame 23a on the one main surface.

Additionally, also one side surface in the short side direction (the side in the obliquely lower left short hand direction in FIGS. 2 and 3) is configured by the metal frame 23a on the main surface, and a metal frame 23c provided almost at a right angle on the metal frame 23b of the side surface in the long side direction.

In this way, the metal frames 23 (23a, 23b) configure an L-shaped metal frame whose cross section perpendicular to the long side direction (also the above described bent direction of the second optical axis O2) is composed of one main surface and one side surface in the long direction, and a frame having an ideal structure implementing high rigidity with a small amount of a material.

At both ends of the metal frame 23 in the long side direction, a fixed molded part formed integrally with the metal frame 23 by using outsert molding is respectively formed. These two fixed molded parts are the first fixed lens frame unit 15 and the second fixed lens frame unit 16, which are also shown in FIG. 1B.

In the first fixed lens frame unit 15, the prism L1 also shown in FIG. 1B, and the lens L2 not shown in FIGS. 2 and 3 are held and fixed. Additionally, in the second fixed lens frame unit 16, the lens L9 which is shown in FIG. 1B but not shown in FIGS. 2 and 3 is held and fixed.

Between the first fixed lens frame unit 15 and the second fixed lens frame unit 16, the 3 movable lens frames (the first movable lens frame 17, the second movable lens frame 18, and the third movable lens frame 19), which are also shown in FIG. 1B, are arranged.

In the three movable lens frames and the two fixed lens frames, an adhesive storing part 24 (see FIG. 2), which prevents an adhesive holding and fixing a lens from overflowing. The adhesive storing part 24 is a tiny space formed between the round surface of the fixed lens and the lens frame.

Adhesive storing parts of the third movable lens frame 19 and the second fixed lens frame unit 16 are not shown in FIGS. 2 and 3 because they are hidden. An adhesive storing part of the first fixed lens frame unit 15 is provided in a portion corresponding to the side of the prism formed integrally with the lens L1, although this is not shown.

Before the above described three movable lens frames are assembled, a zooming shaft cam 25 is arranged adjacently to the side surface of the main fixed lens frame 22 on the open side in the long side direction, and to the side surface of the first fixed lens frame unit 15. The zooming shaft cam 25 comprises a large diameter part forming a round surface on which cam grooves of a cam unit is provided, and small diameter parts 26 (26a, 26b) that are provided to protrude from both of the ends of the large diameter part on the shaft. In the small diameter part 26a that is provided to protrude at the end on the side opposite to the image capturing element 14, a gear 27 is fixed.

After the small diameter part 26a of the zooming shaft cam 25 is inserted into a shaft bearing insertion hole 28 formed in a part bonded integrally with the metal frame 23c of the first fixed lens frame unit 15, the other small diameter part 26b is inserted into a shaft bearing hole which is hidden and not shown, and formed in the first fixed lens frame unit 15 while pulling the zooming shaft cam 25 in the obliquely right direction in FIG. 2, so that the small diameter part 26a is engaged with a shaft bearing 29 in the shaft bearing insertion hole 28. As a result, the zooming shaft cam 25 is held to be rotatable for the first fixed lens frame unit 15.

At the tip of the small diameter part 26a of the zooming shaft cam 25, a convex part 31 having a smaller diameter is formed. The convex part 31 externally protrudes upward from the shaft bearing 29 when the small diameter part 26a engages with the shaft bearing 29. This convex part 31 is pressed by a pressing board spring 32, whereby the zooming shaft cam 25 is aligned by the upper and the lower shaft bearings to be stably supported.

The pressing board spring 32 is configured by: 3 bent leg parts 32-1 formed by separating part of each leg with a notch from an almost square main body, by being bent downward, and by bending the tip to be horizontal; a stop section 32-2 formed by cutting the center of the main body; and a pressing spring part 32-3 formed by being extended integrally from the main body.

In the meantime, on the side of the metal frame 23c, 3 notches 33 are formed in positions corresponding to the 3 bent leg parts 32-1 of the pressing board spring 32, and a convex part 34 corresponding to the stop section 32-2 of the pressing board spring 32 is formed almost at the center enclosed by the 3 notches 33.

When the main body of the pressing board spring 32 is pushed into the side of the metal frame 23c while engaging the 3 bent leg parts 32-1 of the pressing board spring 32 with the 3 notches 33 of the metal frame 23c, the tip of the stop section 32-2 engages with the round surface of the convex part 34. As a result, the pressing board spring 32 is fixed on the outer surface of the metal frame 23c, and the convex part 31 of the zooming shaft cam 25 is pressed by the tip of the pressing spring unit 32-3, so that the zooming shaft cam 25 is aligned.

As a result, the zooming shaft cam 25 is arranged in the neighborhood of the prism L1 held by the first fixed lens frame unit 15 to be orientated in the long side direction of the main fixed lens frame 22, namely, in parallel with the second optical axis O2, and arranged so that at least a portion in the shaft direction is adjacent to the side surface of the prism L1.

Then, a zooming motor unit 35 is arranged in a space (see FIG. 3) shaped almost like a triangle pole, which is formed by a slope of the first fixed lens frame unit 15 holding the back side of the reflection plane of the lens (prism) L1, and the metal frame 23c, and its reduction gear train 36 engages with the gear 27 of the zooming shaft cam 25. The zooming motor unit 35 is fixed to the first fixed lens frame unit 15 by securing with screws two securing parts (see FIG. 3) of a gear shaft fixing part 37 and a stop board fixing part 38 to an alignment hole 39 formed on the first fixed lens frame unit 15 and to a stop hole 41.

Then, an aperture/shutter unit 42 is assembled to the main fixed lens frame 22. The aperture/shutter unit 42 (see FIG. 2) comprises an aperture/shutter part 43 having an aperture which controls the amount of passing light of reflection light forming the second optical axis O2, and a shutter, and rotary solenoids 44 and 45 which respectively drive the aperture and the shutter of the aperture/shutter part 43 in a mechanical manner.

The aperture/shutter part 43 is arranged in the position 21 of the aperture shown in FIG. 1B, and the two rotary solenoids 44 and 45 are arranged below the zooming shaft cam 25.

Furthermore, a vibration wave linear motor 46 for moving and driving the third movable lens frame 19, and a magnetic sensor unit 47 are aligned to overlay in the short side direction of the main fixed lens frame 22 below the aperture/shutter unit 42.

As a result, the vibration wave linear motor 46 is arranged in the position in the direction when the shaft of the zooming shaft cam 25 is extended, and on the side of the image capturing surface.

The magnetic sensor unit 47 (see FIG. 3) comprises a magnetic sensor holder 48, a magnetic sensor 49, a magnetic scale 51, and a pressing spring 52.

The above described vibration wave linear motor 46 and magnetic sensor unit 47 will be described in detail later.

After the above described members are arranged in this way, the first movable lens frame 17, the second movable lens frame 18, and the third movable lens frame 19, to which the movable lens implement 9, 11, and 12 shown in FIG. 1B (but not shown in FIGS. 2 and 3) are respectively fixed with an adhesive, are assembled.

The top and the bottom (the top and the bottom also in FIG. 1B) of each of the lenses L3 to L8 of the movable lens implement 9, 11, and 12, which are respectively held by the first movable lens frame 17, the second movable lens frame 18, and the third movable lens frame 19 and shown in FIG. 1B, for the lens implement 1 shown in FIG. 1A are cut, and the top and the bottom surfaces form flat surfaces, and the lenses are shaped like an oval when viewed at the front, although this is not clearly shown in FIG. 1B because it is the cross-sectional side view.

Additionally, the top and the bottom surfaces (the top and the bottom of the lens implement 1 shown in FIG. 1A, and the top and the bottom of the lens unit shown in FIG. 1B) along the second optical axis O2 are formed to be flat so that the circumferences of the lens holding units of the first, the second, and the third movable lens frames 17, 18, and 19 hold the oval-shaped lens. This leads to a reduction in the thickness of the movable lens frames embedded in the lens implement 1.

For a further reduction in the thicknesses of the second and the third movable lens frames 18 and 19, frame walls, which correspond to the flat surfaces of the bottoms of the lenses, of the bottoms (the bottom portions in FIG. 2, and the top portions in FIG. 3) of the lens frames holding the lenses are cut to form cut parts 18-1 and 19-1, which are shown in FIG. 1B, and the flat parts of the bottoms of the lenses are exposed.

The above described cut part of the second movable lens frame 18 is shown in FIGS. 2 and 3. However, the cut part of the third movable lens frame 19 is not shown because it is hidden by the remaining peripheral portion of the lens frame.

The first movable lens frame 17, the second movable lens frame 18, and the third movable lens frame 19 (see FIG. 2) respectively comprise shaft bearing parts 53 (53-1, 53-2, 53-3), in which guide holes 54 (54-1, 54-2, 54-3) are respectively provided.

Additionally, the first movable lens frame 17, the second movable lens frame 18, and the third movable lens frame 29 respectively comprise U-shaped cut parts 55 (55-1, 55-2, 55-3) at ends as opposed to the shaft bearing parts 53 (see FIG. 3).

Furthermore, a light reflecting member 59 is attached and arranged in a stage height part 58 formed in a boundary among a back portion, which has the above described shaft bearing parts 53 and the U-shaped cut part 55, the outer surface at the opposed front part (see FIG. 2), and a side surface 57 where the shaft bearing parts 53, of the first movable lens frame 17 are arranged.

Still further, cam followers 61 (61-1, 61-2) are respectively formed in a portion which is provided to protrude in the horizontal direction integrally with the shaft bearing part 53-1 of the first movable lens frame 17, and in a portion which is provided to extend integrally with the shaft bearing part 53-2 of the second movable lens frame 18.

Still further, a light reflecting member 62 is attached to a side surface that is provided to be erected in the horizontal direction integrally with the shaft bearing part 53-3 of the third movable lens frame 19.

Still further, convex parts 63 (63-2, 63-3) for reinforcement, which are explained with reference to FIG. 1B, are formed on the outer surface on the front end as opposed to the back end having the shaft bearing parts 53 and the U-shaped cut parts 55.

These convex parts 63 are provided to reinforce the strength of a lens frame, which is insufficient due to the cut wall frame corresponding to the back flat portion of the oval lens in order for a reduction in the thickness of the entire apparatus.

Additionally, a first guide member 65, both ends of which are supported by guide member supporting holes 64 (64-1, 64-2) formed at corners respectively closest to the open side surface and the open main surface of the first fixed lens frame unit 15 and the second fixed lens frame unit 16, is inserted into guide holes 54 of the three movable lens frames.

As a result, the first, the second, and the third movable lens frames 17, 18, and 19 (namely, the 3 movable lens implement 9, 11, and 12) are supported to be movable in the direction of the second optical axis O2 shown in FIG. 1B.

Furthermore, the guide member supporting holes 64(64-1, 64-2) supporting the first guide member 65 are formed at the corners closest to the open side surface and the open main surface, whereby the first guide member 65 is arranged to be as close as possible to an outermost portion in which the open side surface and the open main surface join. The first guide member 65, which is arranged to be as close as possible to the outermost portion, is supported by the shaft bearing parts 53, whereby the 3 movable lens frames are arranged within the narrow and flat main body of the apparatus without wasting space.

When the first guide member 65 is inserted, a compressed spring 66 having pressing force is externally attached to the first guide member 65 between the shaft bearing part 53-1 of the first movable lens frame 17 and the shaft bearing part 53-2 of the second movable lens frame 18.

Additionally, a second guide member 68 is arranged by supporting its both ends with other two guide member supporting holes 67 (see FIG. 3) formed in positions closest to the closed side surface and the open main surface, which are configured by the metal frame 23b, of the first fixed lens frame unit 15 and the second fixed lens frame unit 16, before the three movable lens frames are assembled.

The respective movable lens frames are rotated inside by using the second guide member 68 as a pivot after the above described U-shaped cut parts 55 are supported to freely slide by fitting into the second guide member 68 horizontally, whereby cam followers 61 provided in the first movable lens frame 17 and the second movable lens frame 18 freely and smoothly penetrate into the cam grooves of the zooming shaft cam 25 to engage with, when the three movable lens frames are assembled.

Namely, cams (the cam grooves with which the cam followers 61-1 and 61-2 engage), which respectively correspond to a plurality of lens frames (the first movable lens frame 17 and the second movable lens frame 18 in this example) are respectively formed in the zooming shaft cam 25.

The cam followers 61 penetrate into the cam grooves of the zooming shaft cam 25 as described above, whereby the zooming shaft cam 25, and the first movable lens frame 17 and the second movable lens frame 18 engage with one another to freely slide.

Additionally, the top outer surface 56 (see FIG. 2) of the first movable lens frame 17 is arranged to be close to the back side of the metal frame 23a forming one main surface, and the convex parts 63 for reinforcement, which are formed on the front outer surfaces of the second movable lens frame 18 and the third movable lens frame 19, penetrate into an opening part 69 also formed on the metal frame 23a.

This opening part 69 forms an opening which is vertically long according to the move stroke of a movable lens in order to avoid an interference with the move of a movable lens (see the lenses L5 to L8 shown in FIG. 1B) that moves with the move of the second movable lens frame 18 or the third movable lens frame 19, namely, in order not to prevent the convex parts 63 from moving.

Hereafter, the above described first guide member 65 is inserted into the guide hole 54 of the shaft bearing parts 53 of the movable lens frames, and the guide member supporting holes 64 at both of the ends. As a result, the two guide members (65, 68) are arranged to be adjacent to the zooming shaft cam 25 and in parallel with the shaft of the zooming shaft cam 25.

As described above, the shaft members are arranged to be adjacent and in parallel, which contributes to a reduction in the size of the entire apparatus.

The three movable lens frames (17, 18, 19) are controlled to be able to slide in the direction of the optical axis O2 by being supported by the two guide members, prohibited by one of the guide members from rotating about the other, and aligned in a direction perpendicular to the optical axis O2, so that the movable lens frames are arranged within the main fixed lens frame 22.

Additionally, the compressed spring 66 is arranged between the shaft bearing part 53-1 of the first movable lens frame 17 and the shaft bearing part 53-2 of the second movable lens frame 18 by being externally attached to the first guide member 65, whereby the first movable lens frame 17 and the second movable lens frame 18 are pressed in the mutually reverse directions.

As a result, the cam followers 61-1 and 61-2, which respectively engage with the cam grooves of the zooming shaft cam 25, are respectively pressed against the opposite sides of the wall of the cam grooves of the zooming shaft cam 25. Accordingly, a play occurring between the cam grooves and the cam followers when the zooming shaft cam 25 is driven to rotate is eliminated. As a result, a position relationship when the lens frames move to the left or the right is properly controlled.

In the above described arrangement, the first guide member 65 is arranged to be adjacent and almost in parallel with the zooming shaft cam 25.

Hereafter, the image capturing element 14 is installed on the bottom surface of the second fixed lens frame unit 16. Additionally, a photo-sensor installment hole 71 is provided in a position, which corresponds to the light reflecting member 59 attached to the first movable lens frame 17, on the surface of the first fixed lens frame unit 15, which exists on the same surface of the metal frame 23a. A photo-sensor 72 is arranged in this photo-sensor installment hole 71.

This photo-sensor 72 detects the absolute position of the first movable lens frame. The move distance of the first movable lens frame from the detected absolute position is determined in a way such that the number of steps of a zoom motor of a zooming motor unit 35, which is driven in steps, is counted by a control device not shown.

Additionally, another photo-sensor 73 is arranged in a position, which corresponds to the light reflecting member 62 attached to the third movable lens frame 19, on a side facing the open side of the second lens frame unit 16. This photo-sensor 73 detects the absolute position of the third movable lens frame 19 by detecting the light reflected from the light reflecting member 62 attached to the third movable lens frame 19.

After these absolute positions are determined, the zooming shaft cam 25 rotates in both forward and backward directions within a predetermined angle range by means of the forward and backward rotations of the motor of the zooming motor unit 35. The cam follower 61-1 of the first movable lens frame 17, and the cam follower 61-2 of the second movable lens frame 18 respectively engage with the two cam grooves provided on the outer round surface of the zooming shaft cam 25, whereby the first movable lens frame 17 and the second movable lens frame 18 (namely, the first movable lens unit 9 and the second movable lens unit 11) move close to or apart from each other in the direction of the second optical axis O2. As a result, the image of the pencil of light proceeding in the direction of the optical axis O2 is zoomed in/out.

Additionally, the aperture/shutter unit 42, where the aperture/shutter part 43 is arranged in the aperture position 21 between the first and the second movable lens implement 9 and 11 in FIG. 1B, opens/closes the course of the pencil of light proceeding in the direction of the optical axis O2, and an optical filter (ND filter) controls the amount of light on the image capturing surface.

A vibration wave linear motor that drives the move of the third lens frame holding the third movable lens unit 12 for achieving a focus is described next.

Figure 4A:
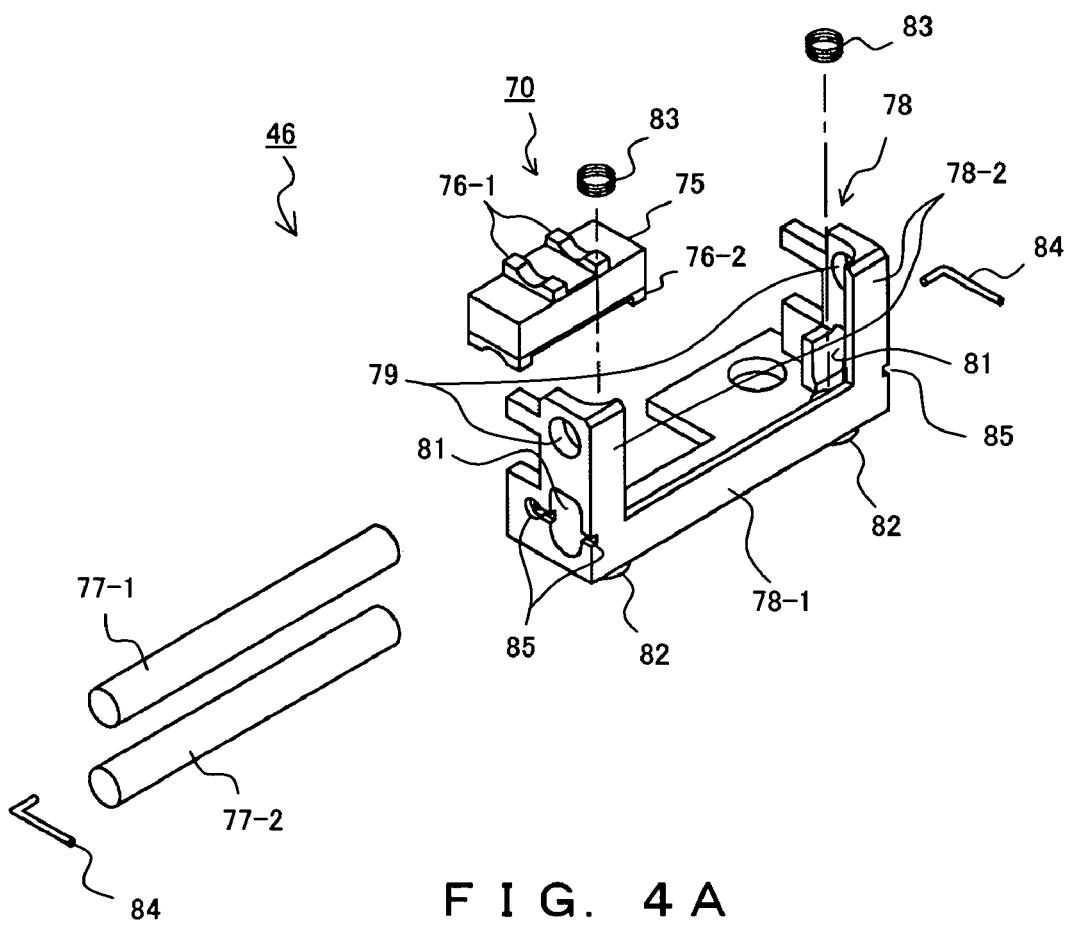
FIG. 4A is a perspective view showing the disassembly of an ultrasonic linear motor according to one preferred embodiment.
Figure 4B:
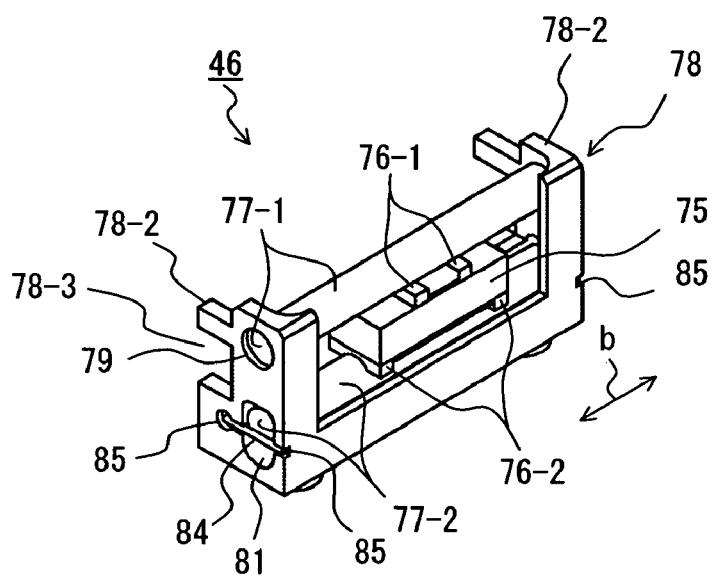
FIG. 4B is a perspective view showing the assembled state of the ultrasonic linear motor shown in FIG. 4A.

FIG. 4A is a perspective view showing the disassembly of the vibration wave linear motor used in this preferred embodiment, whereas FIG. 4B is a perspective view showing its assembled state. As shown in FIGS. 4A and 4B, the vibration wave linear motor 46 comprises a vibrator composed of a vibrator unit 75 shaped like a rectangular parallelepiped, and pluralities (respectively two in this figure) of driving contacting parts 76 (76-1, 76-2), which are formed integrally with or separately from the vibrator unit 75 on opposed two surfaces on the top and the bottom of the vibrator unit 75.

The vibrator unit 75 is shaped like a rectangular parallelepiped without concave and convex portions as described above, whereby the entire motor can be easily reduced in size. Additionally, the driving contacting parts 76 are comprised on the opposed two surfaces, whereby high driving force can be delivered.

The vibration wave linear motor 46 further comprises two guide members 77 (77-1, 77-2) guiding the move of the vibrator 70 by sandwiching the vibrator unit 75 in parallel with the move direction via the driving contacting parts 76 of the vibrator 70, and supporting parts 78 supporting the entire vibrator while aligning the two guide members 77. The driving contacting parts 76 are formed to protrude respectively in the directions of the guide members 77 on their arrangement surfaces.

In the supporting parts 78, fixed shaft bearing holes 79 supporting the upper guide member 77-1 among the two guide members 77 by attaching and fixing the member are formed in upper portions of erecting parts 78-2, which are formed integrally with a base part 78-1 from both ends of the base part 78-1. Under the holes 79, shaft bearing long holes 81 supporting the lower guide member 77-2 to freely move up and down are formed. In the erecting parts 78-2 of the supporting parts 78, open parts 78-3 are formed on the side of supporting the two guide members 77.

Additionally, at the bottom surface in the neighborhood of both of the ends of the base part 78-1 of the supporting parts 78, convex parts 82 are respectively provided in positions, which correspond to both of the ends of the lower guide member 77-2 inserted in the shaft bearing long holes 81. The convex parts 82 are hollow when viewed from upward although this is not shown, and spiral (coil) springs 83 having pressing force are held in the hollow portions.

Additionally, the top ends of the spiral springs 83, which protrude upward from the hollow portions, press the lower guide member 77-2 in the neighborhood of both of its ends, namely, toward the upper guide member 77-1. As a result, the lower guide member 77-2 is pressed against the driving contacting parts 76 on the bottom surface of the vibrator 70, which the lower guide member 77-2 sandwiches along with the upper guide member 77-1, and supported by the shaft bearing long holes 81 to be movable up and down by means of a vibration of the vibrator 70, which will be described later, and the pressing force of the spiral spring 83.

The lower guide member 77-2 is supported by the shaft bearing long holes 81 to be movable up and down as described above, whereby an assembly error between the guide members 77 can be easily absorbed, leading to a reduction in the size of the entire apparatus with ease.

Additionally, the lower guide member 77-2 is pressed with the spiral springs 83 in the neighborhood of both of the ends of the lower guide member 77-2, whereby the lower guide member 77-2 can be evenly pressed against the vibrator 70 over the entire proceeding direction of the vibrator 70. Accordingly, the driving contacting parts can be stably pressed against the guide member 77 all the time in whichever position the vibrator exists. As a result, the stable forward and backward move of the vibrator 70 can be implemented.

Here, the upper and the lower guide members are referred to as the two guide members 77. However, the lower guide member 77-2 may be an upper guide member depending on a position relationship when being assembled in the lens implement 1. Or, if the lens implement 1 is rotated from the state shown in FIG. 1B, the two guide members 77 may be the left and the right members, or front and back members.

Furthermore, the pressing members, which press the neighborhoods of both of the ends of the lower guide member 77-2 in the direction of the upper guide member 77-1, are not limited to the spiral springs 83. Board springs, magnets, etc. may be available. Additionally, the lower guide member 77-2 is not limited to being pressed in the direction of the upper guide member 77-1 with the pressing force, and may be drawn in the direction of the upper guide member 77-1 with drawing force.

Next, drop preventing pins 84 are arranged by making the pins abut on both of the ends of the lower guide member 77-2 that is inserted into the shaft bearing long holes 81 in order to prevent the lower guide member 77-2, which can freely move up and down, from dropping or falling away. Both ends of the drop preventing pins 84 are adhered and secured to pin fixing grooves 85 formed outside the shaft bearing long holes 81. The lower guide member 77-2 is prevented from dropping or falling away by the above described drop preventing pins 84, and its accompanying move in the move direction of the vibrator 70 is restricted.

The above described vibrator 70 moves between the erecting parts 78-2 in a direction in parallel with the guide members 77-1 and 77-2, which is indicated by a bidirectional arrow b shown in FIG. 4B, with a specific vibration to be described later, and the operations of the driving contacting parts 76 and the two guide members 77-1 and 77-2.

In the above described driving contacting parts 76, concave cut parts for being properly guided (or restricted) by the first and the second guide members 77 are provided on surfaces contacting the first and the second guide members 77. As a result, the move direction of the vibrator 70 is restricted to only a direction along the first or the second guide member 77 via the driving contacting parts 76.

As described above, the guide members 77 forming the move path of the vibrator 70 restrict also the move direction of the vibrator 70 via the driving contacting parts 76. Additionally, since 3 or more driving contacting parts 76 are arranged, also the rotation of the vibrator 70 on a plane space formed by the first and the second guide members 76 and 77 is restricted. This eliminates the need for providing a rotation stopper of the vibrator 70, thereby simplifying the configuration.

In the vibration wave linear motor 46 which is shown in FIG. 4B and referred to in this embodiment, the vibrator 70 self-runs along the two guide members 77 as described above. However, for example, if a member sandwiching both of the ends in the move direction of the vibrator 70 is arranged and fixed to a frame, the supporting parts 78 that support the two guide members 77 are to move, and the vibrator 70 and the two guide members 77 have a relationship of a relative move. This will be described in detail later.

FIG. 5A is a front view of the vibrator 70 of the above described vibration wave linear motor 46. FIG. 5B shows its side view. FIG. 5C shows an arrangement of piezoelectric sheets and electrodes of the vibrator 70 shown in FIGS. 5A and 5B. FIGS. 5D and 5E respectively show two other configuration examples of the vibrator. FIG. 5F exemplifies another shape of a coupled driving contacting part.

FIGS. 5A and 5F show the vibrator 70 upside down from the cases shown in FIGS. 4A and 4B. FIGS. 5A and 5F show also electrodes interconnected to the vibrator unit 75, which are not shown in FIGS. 4A and 4B.

As shown in FIGS. 5A and 5B, the vibrator 70 comprises: the vibrator unit 75 configured by a piezoelectric sheet layer 87 composed of stacked piezoelectric sheets 86, and an elastic sheet layer 89 composed of elastic sheets 88 stacked below the piezoelectric sheet layer; and pluralities (a total of 4 units in this example) of driving contacting parts 76 respectively arranged on two opposed surfaces in the stacking direction of the piezoelectric sheets 86 of the vibrator unit 75.

Insulation sheets 91 are respectively attached to the top surface of the piezoelectric sheet layer 87 and the bottom surface of the elastic sheet layer 89. As an insulation sheet 91, the same member as an elastic sheet 88, which is originally an insulation material, may be available.

The above described vibrator unit 75 is manufactured by annealing the stacked piezoelectric sheets 86 and elastic sheets 88, and by performing poling.

The above described driving contacting parts 76 are respectively formed by being closely contacted with the outside surfaces of the insulation sheets 91. Additionally, the respective two driving contacting parts 76 are formed not alone but integrally with a flat board part 92 configured by a board member, so that the two driving contacting parts 76 form a coupled driving contacting part 93 (not the whole but the two driving contacting parts 76 form a contacting unit). Note that the coupled driving contacting part 93 is formed separately from the vibrator unit 75.

The driving contacting parts 76 are formed as a coupled driving contacting part 93 as described above, whereby the efficiency of assembly can be increased in comparison with a case where a plurality of driving contacting parts 76 are separately assembled. However, it is not always necessary to configure the driving contacting parts 76 as the coupled driving contacting parts 93 on both the top and the bottom surfaces. Configuring only one coupled driving contacting part 93 with driving contacting parts on either of the surfaces can also increase the efficiency of assembly.

Preferably, the coupled driving contacting part 93 is made of a resinous material obtained by scattering and solidifying abrasive grains such as alumina powder, etc. Since the acoustic impedance of this material is lower than those of the other portions of the vibrator 70, most parts other than the coupled driving contacting part and close to a longitudinal vibration or a flexion vibration, which will be described later, are excited, leading to the facilitation of design.

Furthermore, a material having both sturdiness and elasticity is selected as the material of the coupled driving contacting part 93, whereby the part can be easily made to vibrate along with the vibrator unit 75, and its abrasion resistance is improved. This contributes to improvements in the durability of the vibration wave linear motor 46.

Additionally, preferably, the size of the flat board part 92 of the coupled driving contacting part 93 is formed to match the surface of the vibrator unit 75 (it is preferable that the surfaces of the coupled driving contacting part 93 and the vibrator unit 75, which are attached to each another, are identical in shape and size. Namely, it is preferable that the bottom surface of the coupled driving contacting part 93 is the same as that of the vibrator unit, to which the coupled driving contacting part 93 is to be attached).

In this way, alignment is facilitated when the coupled driving contacting part 93 is attached to the vibrator unit 75, thereby improving the efficiency of assembly operations. If only one end of the flat board part 92 (coupled driving contacting part 93) is aligned with one end of the surface of the vibrator unit 75 like the lower coupled driving contacting part 93 on the bottom surface shown in FIG. 5F, this can also achieve the same effect.

The piezoelectric sheet layer 87 of the vibrator unit 75 configures a piezoelectric part for mainly giving a forcible vibration, whereas the elastic sheet layer 89 configures an exciting part for exciting particular vibration mode along with the piezoelectric part. However, if desired vibration mode can be excited only with the piezoelectric part, the exciting part is not always required.

The piezoelectric sheets 86 forming the piezoelectric sheet layer 87, and the elastic sheets 88 forming the elastic sheet layer 89 are originally, for example, thin rectangular sheet members made of the same material such as PZT (titanic acid lead zirconate), etc. except whether or not an internal electrode process shown in FIG. 5C is executed. Specifically, each of the sheets is, for example, 10 mm (length) by 2.5 mm (width) by 80 μm (height) (thickness in the stacking direction) in size.

As the PZT material used in this embodiment, a hard material having a Qm value as large as 2000 is selected and used. The same material is used also as an elastic sheet. Additionally, the insulation sheets 91 which sandwich the piezoelectric sheet layer 87 and the elastic sheet layer 89 are made of the same PZT material having a thickness of 40 μm. Although these insulation sheets are made of the same material as that of the piezoelectric sheets, electrodes are not provided thereon. Therefore, the insulation sheets are not polarized and have no piezoelectricity, and actually have a characteristic as an insulation material.

The piezoelectric sheets 86 of the piezoelectric sheet layer 87 are configured by two types of sheet-state piezoelectric elements only having different electrode patterns for which the internal electrode process is executed. One of the two types of the piezoelectric sheets 86 is a piezoelectric sheet 86m partitioned into right and left portions, in which A+ internal electrode foil 94 and B− internal electrode foil 95 are formed, on an entire surface as shown in FIG. 5C. For the A+ internal electrode foil 94 and the B− internal electrode foil 95, terminals 94-1 and 95-1, which are intended to make an external connection, are respectively formed to protrude toward one side of the piezoelectric sheet 86m in positions close to both of the right and left ends.

The other type is a piezoelectric sheet 86n similarly partitioned into right and left portions, in which A− internal electrode foil 96 and B+ internal electrode foil 97 are formed, almost on an entire surface. For the A− internal electrode foil 96 and the B+ internal electrode foil 97, terminals 96-1 and 97-1, which are intended to make an external connection, are formed to protrude toward one side, which is the same as the sheet 86m, of the piezoelectric sheet 86n in positions close to the center between the right and the left portions.

For the above described internal electrode foils, silver-palladium alloy or silver is used as their electrode material. The electrode foils are formed to have a thickness of 4 μm, for example, with vapor deposition and a photolithography technique.

In this preferred embodiment, the piezoelectric sheet layer 87 is configured by alternately stacking these two types of piezoelectric sheets 86m and 86n as a total of 48-sheet layers composed of respective 24 sheets.

In this way, in a middle portion except for the topmost and the bottom most portions, the internal electrodes for applying voltages having reverse potentials to both of a piezoelectric sheet 86 (86m or 86n), on which internal electrode foils are formed, and a piezoelectric sheet 86 (86n or 86m), which the internal electrode foils themselves contact.

The terminals 94-1, 95-1, 96-1, and 97-1, which are formed to protrude toward one side of the piezoelectric sheet 86 (86m, 86n) from the above described A+ internal electrode foil 94, A− internal electrode foil 97, B+ internal electrode foil 97, and B− internal electrode foil 95 and are intended to make an external connection, are respectively connected to an A+ electrode connecting external terminal 98, an A− electrode connecting external terminal 99, a B+ electrode connecting external terminal 101, and a B− electrode connecting external terminal 102, which are made of baked silver, on one side surface (one of two side surfaces that are parallel to the two guide members 77 shown in FIGS. 4A and 4B and do not face the guide members 77) of the vibrator unit 75 shown in FIG. 5A.

The A+ electrode connecting external terminal 98 and the A− electrode connecting external terminal 99 are configured as A phase electrodes, whereas the B+ electrode connecting external terminal 101 and the B− electrode connecting external terminal 102 are configured as B phase electrodes. In this case, the A− electrode connecting external terminal 99 and the B− electrode connecting external terminal 102 are configured for connecting to A phase and B phase grounds (GNDs). Therefore, these terminals may be configured to have the same electric potential by connecting to the same lead wire, etc. in this case.

A voltage is applied from a driving circuit to be described later to the piezoelectric sheet layer 87 via these A phase and B phase electrode connecting external terminals, so that the vibrator unit 75 generates an ultrasonic elliptical vibration to be described later.

The vibrator unit 75 in this preferred embodiment is configured, for example, to be 10 mm (length) by 2 mm (width) by 2.5 mm (height) in size. In this vibrator unit 75, a pin member installment hole 103, which is not shown in FIGS. 4A and 4B, is formed almost in the middle of the A phase and the B phase electrodes, namely, almost in a central part of the vibrator unit 75. The pin member installment hole 103 will be described later.

Additionally, the piezoelectric unit is not limited to the piezoelectric sheet layer 87. For example, the following configuration may be available. FIG. 5D shows the configuration as a piezoelectric unit, where coupled driving contacting parts are attached to a vibrator unit, which is obtained by adhering and linking piezoelectric parts 129 composed of stacked layer piezoelectric parts or piezoelectric elements, a vibrator unit principal part 130 made of, for example, brass, and vibrator unit components 131. The vibrator unit principal part 130 and the vibrator unit components 131 configure an exciting unit.

FIG. 5E shows a configuration where thin single board piezoelectric parts 133 and coupled driving contacting parts 93 are attached to a rectangular-parallelepiped-shaped elastic part 132 made of, for example, brass. The elastic part 132 configures an exciting unit. Attaching these parts by applying sufficient pressure when the parts are attached is vital to increase a vibration transmission efficiency.

FIG. 6 shows a driving circuit driving and controlling a vibration wave linear motor 46 having the above described configuration. The driving circuit 105 shown in this figure is mounted along with an AF (Auto Focus) circuit 106 on the circuit board 2 shown in FIG. 1A.

Upon receipt of any of forward and backward instruction signals along with any of move and stop instruction signals from the AF circuit 106, a CPU (Central Processing Unit) 107 of the driving circuit 105 outputs a corresponding signal to an oscillation circuit 108 and a 90° phase circuit 109.

Upon receipt of the move signal, the oscillation circuit 108 applies an ultrasonic driving voltage to the A phase electrodes 98 and 99 of the vibration wave linear motor 46 via an amplifier 110, and outputs the same ultrasonic driving voltage to the 90° phase circuit 109.

The 90° phase circuit 109 shifts the phase of the frequency of the ultrasonic driving voltage input from the oscillation circuit 108 by +90° or −90° based on the forward or backward instruction signal received along with the move signal from the CPU 107, and applies the voltage to the B phase electrodes 101 and 102 of the vibration wave linear motor 46 via another amplifier 111.

As a result, the vibration wave linear motor 46 self-runs in a predetermined direction as will be described later by making an ultrasonic vibration, and moves the third movable lens frame 19 in a predetermined direction along with the optical axis O2.

As described above, the absolute position of the third movable lens frame 19 is detected by the reflector (light reflecting member 62) and the photo-sensor 73 of a reflection type in advance. The detected absolute position is notified to the CPU 107.

In the meantime, the move amount of the third movable lens frame 19 is detected in a way such that the magnetic sensor reads the magnetic scale of the magnetic sensor unit 47. A pulse signal, which indicates the move amount read by the magnetic sensor, is output to a counter 113 via an amplifier 112. The counter 113 measures the pulse signal indicating the move amount, and outputs a measurement result to the CPU 107.

The CPU 107 recognizes the current position of the third movable lens frame 19 based on the absolute position of the third movable lens frame 19, which is input from the photo-sensor 73, and the measurement result of the move amount, which is input from the counter 113, and notifies the AF circuit 106 of the recognized current position of the third movable lens frame 19. The CPU 107 stops the output of the oscillation circuit according to the stop signal from the AF circuit 106.

FIGS. 7A and 7B are perspective views schematically explaining ultrasonic elliptical vibrations of the vibrator unit 75 of the vibration wave linear motor 46 that is oscillated and driven as described above.

Firstly, if an alternating current voltage having the same phase in the neighborhood of a frequency 160 kHz is applied to the A phase electrodes 98 and 99 and the B phase electrodes 101 and 102 of the vibrator unit 75 shown in FIG. 5A, a primary longitudinal vibration is excited in the vibrator unit 75. Or, if an alternating current voltage having a reverse phase in the neighborhood of the frequency 160 kHz is applied to the A phase electrodes 98 and 99 and the B phase electrodes 101 and 102, a secondary flexion vibration is excited in the vibrator unit 75.

These vibrations were analyzed with a finite element method by using a computer, so that a resonant longitudinal vibration posture shown in FIG. 7A, and a resonant flexion vibration posture shown in FIG. 7 were respectively expected. Results of the supersonic vibration measurement proved these expectations.

In this preferred embodiment, the resonant frequency of the secondary flexion vibration is designed to be lower than that of the primary longitudinal vibration by several percent (preferably 3 percent or so). With such a configuration, the output characteristic as the vibration wave linear motor can be significantly improved as will be described later.

Next, by applying an alternating current voltage having a phase different by $\pi/2$ in the neighborhood of 160 kHz to the A phase electrodes 98 and 99 and the B phase electrodes 101 and 102 of the vibrator unit 75, an elliptical vibration can be observed in the positions of the driving contacting parts 76 of the vibrator 70.

In this case, the direction of the rotation of the elliptical vibration caused by the supersonic vibration in the positions of the driving contacting parts 76 arranged on the bottom surface of the vibrator 70, and that of the rotation of the elliptical vibration caused by the supersonic vibration in the positions of the driving contacting parts 76 arranged on the top surface become reverse.

FIGS. 8A and 8B schematically show the elliptical vibrations of the driving contacting parts of the vibrator when the alternating current voltage having the phase different by $\pi/2$ in the neighborhood of 160 kHz is applied. FIG. 8A shows operations performed when the phase of the alternating current voltage, which is applied to the A phase electrodes 98 and 99, is behind by $\pi/2$ from the phase of the alternating current voltage, which is applied to the B phase electrodes 101 and 102. In this figure, the driving contacting parts 76 on the bottom surface of the vibrator 70 rotate in a counterclockwise direction, whereas the driving contacting parts 76 on the top surface rotate in a clockwise direction.

FIG. 8B shows operations performed when the phase of the alternating current, which is applied to the A phase electrodes 98 and 99, is ahead by $\pi/2$ from the phase of the alternating current voltage applied to the B phase electrodes 101 and 102. In this figure, the driving contacting parts 76 on the bottom surface of the vibrator 70 rotate in the clockwise direction, whereas the driving contacting parts on the top surface rotate in the counterclockwise direction.

As described above, it is preferable that the driving contacting parts on the same surface are arranged in positions where they rotate in the same direction, and the driving contacting parts on the opposite surface are arranged in positions where they rotate in a reverse direction. As a result, driving force can be taken out most efficiently.

Namely, the elliptical vibration into which the longitudinal vibration and the flexion vibration of the vibrator unit 75 are synthesized acts on the two guide members 77 via the 4 driving contacting parts 76, and the vibrator unit 75 moves forward and backward between both of the erecting parts 78-2 of the supporting part 78 along the two guide members 77 as a counteraction. This is the operational principle of the vibration wave linear motor according to the present invention.

In this preferred embodiment, the piezoelectric units are configured by two portions such as the A phase where the A phase electrodes 98 and 99 are arranged, and the B phase where the B phase electrodes 101 and 102 are arranged. However, the piezoelectric units are not limited to 2 portions. 3 portions or more may be available as far as they can cause the longitudinal vibration and the flexion vibration.

Additionally, since the vibrator 70 has a shape of almost a rectangular parallelepiped in this preferred embodiment, the above described driving force can be obtained with the longitudinal vibration and the flexion vibration. However, the vibrator may have another shape as far as the driving force can be obtained by causing the elliptical vibration in the driving contacting parts. Or, a similar vibration can be obtained by simultaneously exciting one or a plurality of modes of the same frequency or frequencies of an integer multiple.

Furthermore, it is preferable that the driving contacting parts are arranged in arbitrary positions where the output characteristic of the highest level can be obtained as the vibrator linear motor, namely, positions where the ultrasonic elliptical vibration of the highest level of the vibrator 70 is made. Normally, however, since making an elliptical vibration becomes the source of driving, an elliptical vibration occurs in one or more driving contacting parts. Therefore, the driving contacting parts may be arranged so that the total sum of driving force caused by a vibration that occurs in the positions of all of the driving contacting parts does not become zero.

Furthermore, it is unnecessary that an elliptical vibration occurs in positions of all of driving contacting parts. Even if a single vibration or a vibration in a reverse direction occurs, it does not matter as far as the total sum of driving force from driving contacting parts is not zero but driving force in one direction.

A configuration where forward and backward moving force of the vibrator 70 within the vibration wave linear motor 46, which is caused by the above described elliptical vibration, is taken out as the moving driving force of the third movable lens frame 19 is described next.

FIG. 9A is a perspective view explaining a method linking the above described vibration wave linear motor 46 and the third movable lens frame 19. FIG. 9B is an enlarged perspective view showing only the linked part. FIG. 9C is an enlarged view showing the magnetic sensor unit detecting the move amount of the third movable lens frame 19.

FIG. 10A is a schematic showing FIG. 9B when viewed in a direction of an arrow c. FIG. 10B is a cross-sectional view of FIG. 9B when taken along an arrow line A–A'.

FIG. 9A is a schematic showing the vibration wave linear motor 46 and the third movable lens frame 19 in FIG. 3. Additionally, this figure shows a pin member 115 for taking out a move output, which is fixed by being inserted into the inside from the pin member installment hole 103 shown in FIG. 5A in the center on the surface, where the pin is fixed, at an obliquely upper left on the opposite side of the vibrator 70, and is pulled out on the side where the pin is fixed for ease of understanding.

As shown in FIG. 9A, the third movable lens frame 19 is configured by the lens frame main unit 116 holding the third movable lens unit 12, a shaft bearing part 53-3, and an engaging protruding part 117 provided to protrude downward from the shaft bearing part 53-3. A long hole 118, which extends in a direction parallel with the direction where the lens frame main unit 116 moves along the optical axis O2, is provided almost in a central portion of the engaging protruding part 117.

In the long hole 118 (see also FIGS. 10A and 10B), a board spring 119, which presses the portion (the long hole 118 of the engaging protruding part 117) where the pin member 115 for taking out a move output abuts on the third movable lens frame 19, is engaged from the opposite side in this figure.

The board spring 119 is configured by a flat main part 119-1, an engaging part 119-2 bent in two stages toward the front and then upward from the bottom of the main part 119-1, and a pressing part 119-3 bent toward the front from the left end of the main part 119-1.

For this board spring 119, its engaging part 119-2 engages with the engaging protruding part 117 by wrapping the bottom of the engaging protruding part 117 where the long hole 118 of the third movable lens frame 19 is formed. As a result, the main part 119-1 of the board spring 119 closely contacts with the long hole 118 on the opposite side, and the pressing part 119-3 is inserted in a predetermined position within the long hole 118 from the opposite side.

Between the pressing part 119-3 and the left end of the long hole 118, a gap in which the pin member for taking out a move output is inserted is formed.

Between a side surface 116-1 on the opposite side of the lens frame main unit 116 of the third movable lens frame 19 and a surface on the front side of the engaging protruding part 117, a clearance for arranging the vibrator 70 of the vibration wave linear motor 46, and a flexible board connected to the A+ electrode connecting external terminal 98, the A− electrode connecting external terminal 99, the B+ electrode connecting external terminal 101, and the B− electrode connecting external terminal 102 of the vibrator 70, which are shown in FIG. 5, is formed.

When the vibration wave linear motor 46 is arranged in this clearance, the pin member 115 for taking out a move output is inserted in the gap formed between the pressing part 119-3 and the left end of the long hole 118 as shown in FIG. 9B.

With this engagement, the movements of the pin member 115 for taking out a move output 115 in the direction of the second optical axis O2 are prohibited within the long hole 118, and the pin member 115 faithfully transmits the move of the vibrator 70 of the vibration wave linear motor 46, which is arranged by being fixed to the metal frame 23a not shown (see FIG. 2), in the direction of the optical axis O2 to the third movable lens frame 19.

Additionally, for the pin member 115, a play is allowed in its upward and downward movements in the above described engagement. This play absorbs a positional deviation, etc. when the vibrator 70 and the two guide members 77 (77-1, 77-2) are installed.

Furthermore, the pin member 115 for taking out a move output accurately transmits the direction and the force of the move of the vibrator 70 in the direction of the second optical axis O2 to the third movable lens frame 19 as described above. In the meantime, the pin member 115 absorbs the upward and downward movements of the vibrator 70, which are caused by the elliptical vibration, etc., with the upward and downward movements within the long hole 118, and does not transmit to the third movable lens frame 19.

As described above, as the linkage between the vibrator 70 and the third movable lens frame 19, a linked state implemented with the pin member 115 for taking out a move output, which is fixed to the vibrator 70 and only abuts on the portion (the long hole 118 of the engaging protruding part 117) on the third movable lens frame 19 with the pressing force of the board spring 119, is formed. As a result, the move force (driving force) of the vibrator 70 is transmitted to the move of the third movable lens frame 19.

As described above, the pin member 115 is a move driving transmitting member for transmitting the move driving force of the vibrator 70 to an outside (a move driving mechanism within an electronic appliance, an element to be driven to move within a device) when the vibration wave linear motor 46 is comprised in the electronic appliance, device, etc.

Additionally, in this preferred embodiment, the pin member 115 for externally taking out the moving force of the vibrator 70 (driving force of the driving contacting parts 76) is arranged by being fixed to the central part of the vibrator 70, namely, a section common to the primary longitudinal vibration and the secondary flexion vibration (neighborhood of a stationary point in each of the vibration modes). Even if another vibration mode or a synthesis of vibration modes is used as the vibration mode of the vibrator, the pin member 115 is arranged in a section common to the vibration modes, or a portion where the vibration becomes minimal, whereby the moving force of the vibrator can be transmitted to a member to be moved without impeding the vibration of the vibrator.

In the meantime, in the vibration wave linear motor 46 in this preferred embodiment shown in FIG. 4B, the vibrator 70 and the two guide members 77 were described to have a relationship of a relative move. If this relative move is described with reference to FIG. 9A, the vibrator 70 which self-runs against the fixed supporting part 78 moves the third movable lens frame 19 linked to the vibrator 70 in the case of FIG. 9A. Assume a configuration where both of the ends of the vibrator 70 in the move direction are sandwiched by an elastic member which does not prevent the vibration of the vibrator 70, this elastic member is fixed to the metal frame 23a, and a supporting part supporting the two guide members 77 is formed in a suitable position of the third movable lens frame 19.

With such a configuration, the vibrator 70 is arranged by being fixed, and the two guide members 77 which are driven by the driving contacting parts 76 of the vibrator 70 are moved. Namely, the third movable lens frame 19 linked to the two guide members 77 moves.

Such a configuration can be also implemented. Accordingly, the description that the vibrator 70 and the two guide members 77 have a relationship of a relative move was provided. However, the following description sometimes states that the vibrator 70 self-runs against the two guide members 77 based on the configuration shown in FIG. 9A.

In the linked configurations shown in FIGS. 9A to 9C, one end, which is not shown by being hidden, of the magnetic scale 121 of the magnetic sensor unit 47 is arranged by being fixed to the engaging protruding part 117, and the magnetic sensor 122 of the magnetic sensor unit 47 is arranged by being fixed to the metal frame 23a, which is not shown in FIG. 9, in a position as opposed to the other end, which is shown, of the magnetic scale 121.

The magnetic sensor 122 is arranged by being fixed to the metal frame 23a in a way such that the magnetic sensor 122 is fit into the sensor holding frame 123, and a fixing board 124 fixing the sensor holding frame 123 is fixed to the metal frame 23a with a fixing hole 124-1. Additionally, a board spring member 125 pressing the magnetic scale 121 in the direction of the magnetic sensor 122 is simultaneously arranged by being fixed.

Figure 11:
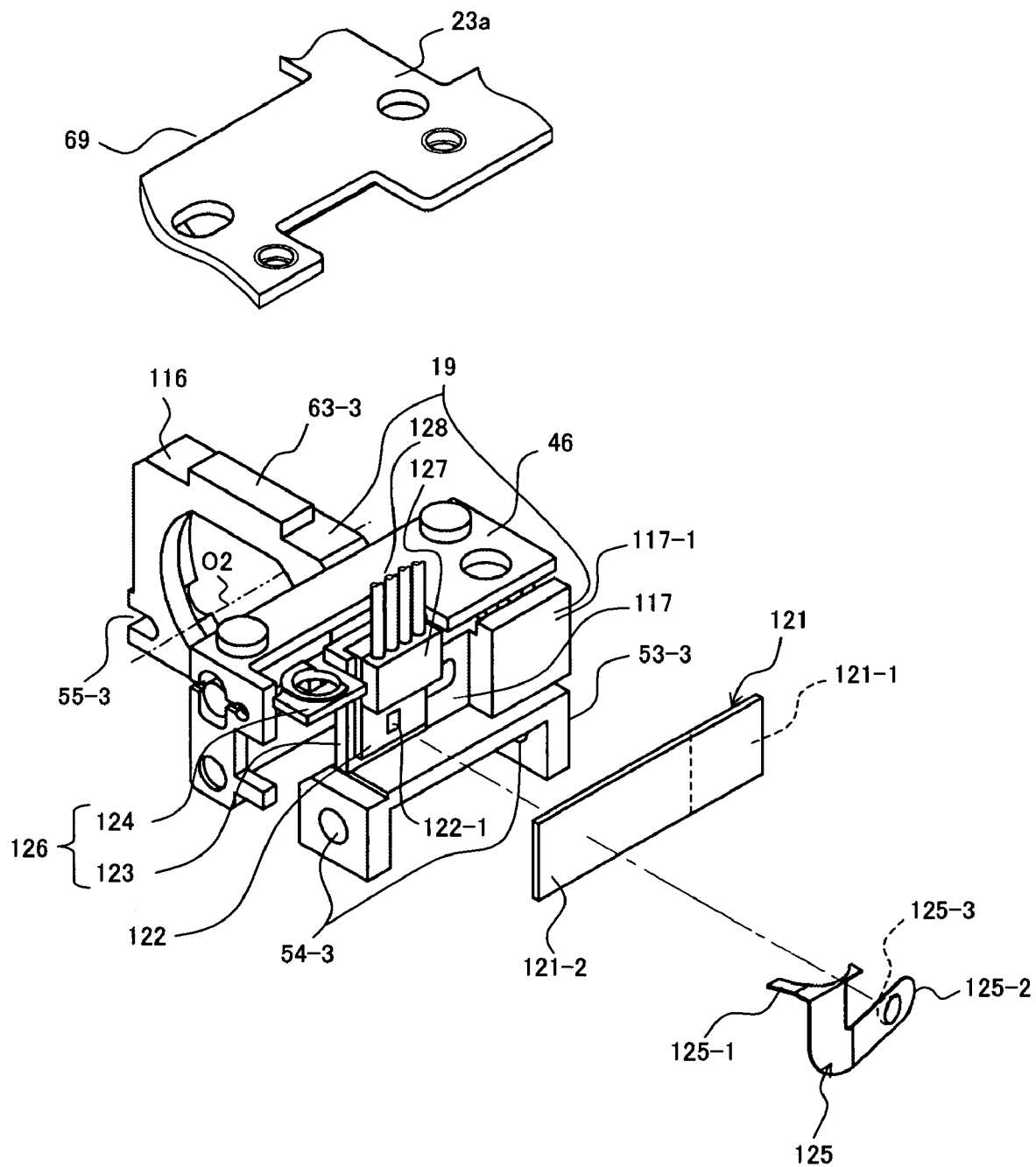
FIG. 11 is a partial perspective view showing the detailed configuration of the magnetic sensor unit along with the vibration wave linear motor where the magnetic sensor unit is assembled, and the third movable lens frame.

FIG. 11 is a perspective view showing a partial disassembly of the detailed configuration of the magnetic sensor unit 47 shown in FIGS. 2 and 3 along with the vibration wave linear motor 46 in which the magnetic sensor unit 47 is assembled, and the third movable lens frame 19.

The magnetic sensor unit 47 is arranged to detect the move distance of the third movable lens frame 19 from an absolute position after the photo-sensor 73 shown in FIG. 2 detects the absolute position of the third movable lens frame 19.

As shown in FIG. 11, the above described vibration wave linear motor 46 is arranged between the side surface (the side surface opposite to the side surface on which the U-shaped cut part 55-3 exists) of the lens frame main unit 116 of the third movable lens frame 19 and the engaging protruding part 117 as described with reference to FIG. 9A. This vibration wave linear motor 46 is fixed to the metal frame 23a along with the magnetic sensor holder 126 (the sensor holding frame 123 and the fixing board 124).

The fixing board 124 of the magnetic sensor holder 126 is configured to be engaged with an engaging part 125-1 of the board spring 125, and the sensor holding frame 123 of the magnetic sensor holder 126 holds the magnetic sensor 122.

A detecting unit 122-1 for detecting magnetism is formed almost in the central part of the magnetic sensor 122. Additionally, 4 electrode lead wires 128 whose electric connections to the magnetic sensor 122 are reinforced with an adhesive 127 are drawn from the top of the detecting unit 122-1.

Additionally, an engaging part 121-1 of the magnetic scale 121 is attached to a scale holding part 117-1 which forms a flat part by extending outside (obliquely lower right direction in FIG. 11) with a predetermined step height from the engaging protruding part 117 which erects (which erects under the shaft bearing part 53-5 because it is viewed upside down in FIGS. 3 and 9A) above the shaft bearing part 53-5 of the third movable lens frame. With this configuration, the magnetic scale 121 is fixed to the scale holding part 117-1 by orientating its scale surface toward the detecting unit 122-1 of the magnetic sensor 122.

This magnetic scale 121 is installed by being fixed to the third movable lens frame 19 via the scale holding part 117-1, whereas the magnetic sensor 122 is fixed to the metal frame 23*a*. Additionally, the third movable lens frame 19 is arranged to be movable along the two guide members (65, 68) against the metal frame 23*a* as described above, whereby also the magnetic sensor 122 and the magnetic scale 121 are arranged to be relatively movable.

This magnetic scale 121 is made of an elastic sheet material, for example, a resinous sheet such as polyester, etc., and obtained by coating a magnetic material on the scale surface side, and by magnetizing the magnetic material at predetermined intervals. To make the magnetic sensor 122 read the magnetism, it is preferable that the scale surface of the magnetic scale 121 and the detecting unit 122-1 of the magnetic sensor 122 are as close as possible at all times.

Accordingly, a board spring 125 is provided. Namely, the board spring 125 comprises a spring part 125-2 which extends downward from an engaging part 125-1 and further extends horizontally in the form of a hook. At the end of the spring part 125-2, a dome-shaped convex part 125-3 which is provided to protrude toward the side of the magnetic scale 121 is formed. This convex part 125-3 is formed in a position corresponding to the detecting unit 122-1 of the magnetic sensor 122.

The engaging part 125-1 of the board spring 125 is fixed to the metal frame 23*a* along with the fixing board 124 of the magnetic sensor holder 126, whereby the convex part 125-3 of the board spring 125 presses a portion, namely, a free end side 121-2, which is not fixed to the engaging part 117-1 of the magnetic scale 121, against the detecting unit 122-1 of the magnetic sensor 122.

As a result, the scale surface of the magnetic scale 121 makes a relative move while sliding and contacting the detecting unit 122-1 of the magnetic sensor 122. The scale surface of the magnetic scale 121 slides and contacts the detecting unit 122-1 of the magnetic sensor 122 in this way, whereby the magnetic sensor 122 can properly read the scale of the magnetic scale 121.

As described above, the portion of the board spring 125, which presses the back side of the scale surface of the magnetic scale 121, is formed by the dome-shaped convex part 125-3. Therefore, frictional resistance with the magnetic scale 121 is extremely small, thereby reducing resistance load generated by the pressing.

Additionally, it is preferable to paste non-magnetic metal foil having a smooth surface, or to form a smooth resinous layer on the back side of the magnetic scale 121. This can suppress the abrasion caused by the friction with the board spring 125 to be low, and the lifetime of the apparatus can be maintained for a long time.

As described above, in this preferred embodiment, the vibration wave linear motor caused by driving a vibration wave has a simple configuration where a plurality of driving contacting parts are provided on two opposed surfaces of the ultrasonic vibrator shaped like a rectangular parallelepiped, and both of the surfaces on which the driving contacting parts are arranged are supported by guide members. This allows the ultrasonic vibrator, which does not require a dedicated rotation stopper, to self-run, conventionally required movable rail, table linked to the movable rail, etc. become unnecessary, and also an arrangement space of the respective units in the configuration becomes extremely small.

Accordingly, for example, if the linear motor is embedded in a main body apparatus such as a lens implement, etc., a small arrangement space such as a narrow clearance between the housing of the main body apparatus and a lens frame to be driven is sufficient. As a result, the vibration wave linear motor that is reduced in size with such a simple configuration can be provided.

Furthermore, a plurality of driving contacting parts are arranged in the vibrator, and made to slide along the guide members with optimum pressing force. As a result, driving force generated by the vibration wave elliptical vibration of the ultrasonic vibrator can be sufficiently delivered, and the running of the vibrator can be stabilized. As a result, the operation performance as a vibration wave linear motor can be improved.

The above described preferred embodiment adopts the configuration where the guide members are fixed, and the vibrator move along the guide members. Inversely, however, the vibrator may be fixed, and the guide members may be moved as members to be driven. In either case, it goes without saying that the configuration where the guide members and the vibrator make a relative move remains unchanged.

As described above, according to the present invention, a vibration wave linear motor is configured with a simple shape composed of a rectangular parallelepiped vibrator, and guide members sandwiching and guiding the forward and backward move of the vibrator, whereby the vibration wave linear motor the size of which can be reduced with the simple configuration can be provided.

What is claimed is:

1. A vibration wave linear motor, comprising:
   a vibrator unit configured by comprising a piezoelectric unit;
   driving contacting parts respectively provided on two opposed surfaces of the vibrator unit;
   two guide members sandwiching the vibrator unit via the driving contacting parts; and
   a pressing member pressing one of the two guide members against the other, and generating pressing force between the two guide members and the driving contacting parts, wherein
   the driving contacting parts convert a vibration generated by applying a voltage to the vibrator unit into driving force, whereby the vibrator unit and the two guide members make a relative move, the two guide members being arranged in parallel with a direction of the relative move with the vibrator unit and forming a relative move path, the driving force being transmitted from the driving contacting parts, and one of the guide members restricting the direction of the relative move with the vibrator.

2. The vibration wave linear motor according to claim 1, wherein the piezoelectric unit includes stacked piezoelectric sheets.

3. The vibration wave linear motor according to claim 1, further comprising a holding member holding the guide members, wherein the holding member supports one of the two guide members to be movable in a direction of being pressed by the pressing member.

4. The vibration wave linear motor according to claim 3, wherein the pressing member is coil springs that are respectively provided in positions on a side of the holding member, which correspond to both ends of the guide member held to be movable, and have pressing force.

5. The vibration wave linear motor according to claim 4, wherein the holding member comprises a restricting member restricting a move of the guide member held to be movable in the direction of the relative move with the vibrator unit.

6. The vibration wave linear motor according to claim 3, wherein the holding member comprises a restricting member restricting a move of the guide member held to be movable in the direction of the relative move with the vibrator.

7. The vibration wave linear motor according to claim 1, wherein the vibrator unit is shaped like a rectangular parallelepiped, at least two or more driving contacting parts are arranged on one of the two opposed surfaces of the vibrator unit, at least one or more driving contacting parts are arranged on the other surface, and the driving contacting parts are formed to protrude in a direction of the guide members from the surfaces where the driving contacting parts are arranged.

8. The vibration wave linear motor according to claim 7, wherein a plurality of driving contacting parts arranged on at least one of the two surfaces form a mutuallycoupled driving contacting part, which is formed separately from the vibrator unit.

9. The vibration wave linear motor according to claim 8, wherein the coupled driving contacting part is made of a resinous material containing abrasive grains.

10. The vibration wave linear motor according to claim 8, wherein one end of the coupled driving contacting part matches a side surface of the vibrator unit.

11. The vibration wave linear motor according to claim 10, wherein the coupled driving contacting part comprises a flat board for coupling a plurality of driving contacting parts, and a size of the flat board is a size which matches the one surface.

12. The vibration wave linear motor according to claim 10, wherein attached surfaces of the coupled driving contacting part and the vibrator unit are attached are identical.

13. The vibration wave linear motor according to claim 10, wherein the vibrator unit is sandwiched by a plurality of members to be driven via the driving contacting parts.

14. A vibration wave linear motor, comprising:
   a vibrator having a vibrator unit configured by comprising a piezoelectric unit, and a coupled driving contacting part which is made of a material different from the vibrator unit, obtained by coupling a plurality of driving contacting parts as one body, and arranged on the vibrator unit;
   a member to be driven, which contacts the driving contacting parts of the vibrator; and
   a pressing member relatively pressing the member to be driven against the driving contacting parts, and generating pressing force between the driving contacting parts and the member to be driven, wherein
   the driving contacting parts convert a vibration, which is generated by applying a voltage to the vibrator unit, into driving force, whereby the vibrator and the member to be driven make a relative move.

15. The vibration wave linear motor according to claim 14, wherein the coupled driving contacting part is made of a resinous material containing abrasive grains.

16. The vibration wave linear motor according to claim 14, wherein at least one end of the coupled driving contacting part matches a side surface of the vibrator unit.

17. A lens implement comprising the vibration wave linear motor according to claim 1 as a driving source of a lens for achieving a focus.

18. A lens implement comprising the vibration wave linear motor according to claim 14 as a driving source of a lens for achieving a focus.

* * * * *